United States Patent
Diorio et al.

(10) Patent No.: US 7,212,446 B2
(45) Date of Patent: May 1, 2007

(54) COUNTERACTING OVERTUNNELING IN NONVOLATILE MEMORY CELLS USING CHARGE EXTRACTION CONTROL

(75) Inventors: Christopher J. Diorio, Shoreline, WA (US); Chad A. Lindhorst, Seattle, WA (US); Shailendra Srinivas, Seattle, WA (US); Alberto Pesavento, Seattle, WA (US); Troy N. Gilliland, Seattle, WA (US)

(73) Assignee: Impinj, Inc., Seattle, WA (US)

( * ) Notice: Subject to any disclaimer, the term of this patent is extended or adjusted under 35 U.S.C. 154(b) by 171 days.

(21) Appl. No.: 10/830,280

(22) Filed: Apr. 21, 2004

(65) Prior Publication Data

US 2004/0195593 A1    Oct. 7, 2004

Related U.S. Application Data

(63) Continuation-in-part of application No. 10/245,183, filed on Sep. 16, 2002, now Pat. No. 6,853,583.

(51) Int. Cl.
    *G11C 11/34* (2006.01)
(52) U.S. Cl. .......................... 365/185.21; 365/189.09; 365/104
(58) Field of Classification Search ........... 365/185.21, 365/189.09, 104, 177, 149, 183, 182, 184
    See application file for complete search history.

(56) References Cited

U.S. PATENT DOCUMENTS 4,935,702 A    6/1990    Mead et al.
4,953,928 A    9/1990    Anderson et al.
5,146,106 A    9/1992    Anderson et al.
5,301,150 A    4/1994    Sullivan et al.
5,596,524 A    1/1997    Lin et al.

(Continued)

FOREIGN PATENT DOCUMENTS

EP    0 778 623    6/1997

OTHER PUBLICATIONS

International Search Report, for International Application No. PCT/US2005/013644, date mailed Aug. 3, 2005.

(Continued)

*Primary Examiner*—Richard T. Elms
*Assistant Examiner*—Dang Nguyen
(74) *Attorney, Agent, or Firm*—Thelen Reid Brown Raysman & Steiner LLP; David B. Ritchie

(57) ABSTRACT

Methods and apparatuses prevent overtunneling in nonvolatile floating gate memory (NVM) cells. An individual cell includes a circuit with a transistor that has a floating gate that stores charge, and a capacitor structure for extracting charge from the gate, such as by tunneling. A counteracting circuit prevents extracting charge from the floating gate beyond a threshold, therefore preventing overtunneling or correcting for it. In one embodiment, the counteracting circuit supplies electrons to the floating gate, to compensate for tunneling beyond a point. In another embodiment, the counteracting circuit includes a switch, and a sensor to trigger the switch when the appropriate threshold is reached. The switch may be arranged in any number of suitable ways, such as to prevent a high voltage from being applied to the capacitor structure, or to prevent a power supply from being applied to a terminal of the transistor or to a well of the transistor.

40 Claims, 21 Drawing Sheets

U.S. PATENT DOCUMENTS

| | | | |
|---|---|---|---|
| 5,616,942 A | 4/1997 | Song | |
| 5,617,358 A | 4/1997 | Kodama | |
| 5,623,442 A * | 4/1997 | Gotou et al. | 365/185.08 |
| 5,627,392 A | 5/1997 | Diorio et al. | |
| 5,650,966 A | 7/1997 | Cleveland et al. | |
| 5,687,118 A | 11/1997 | Chang | |
| 5,706,227 A | 1/1998 | Chang et al. | |
| 5,736,764 A | 4/1998 | Chang | |
| 5,754,471 A | 5/1998 | Peng et al. | |
| 5,761,121 A | 6/1998 | Chang | |
| 5,763,912 A | 6/1998 | Parat et al. | |
| 5,777,361 A | 7/1998 | Parris et al. | |
| 5,786,617 A | 7/1998 | Merrill et al. | |
| 5,825,063 A * | 10/1998 | Diorio et al. | 713/600 |
| 5,841,165 A | 11/1998 | Chang et al. | |
| 5,844,300 A | 12/1998 | Alavi et al. | |
| 5,892,709 A * | 4/1999 | Parris et al. | 365/185.01 |
| 5,898,613 A | 4/1999 | Diorio et al. | |
| 5,912,842 A | 6/1999 | Chang et al. | |
| 5,969,987 A | 10/1999 | Blyth et al. | |
| 5,990,512 A | 11/1999 | Diorio et al. | |
| 6,028,789 A * | 2/2000 | Mehta et al. | 365/185.14 |
| 6,049,229 A * | 4/2000 | Manohar et al. | 326/83 |
| 6,055,185 A | 4/2000 | Kalnitsky et al. | |
| 6,081,451 A | 6/2000 | Kalnitsky et al. | |
| 6,137,721 A | 10/2000 | Kalnitsky et al. | |
| 6,137,722 A | 10/2000 | Kalnitsky et al. | |
| 6,137,723 A | 10/2000 | Bergemont et al. | |
| 6,137,724 A | 10/2000 | Kalnitsky et al. | |
| 6,166,954 A | 12/2000 | Chern | |
| 6,208,557 B1 | 3/2001 | Bergemont et al. | |
| 6,222,771 B1 | 4/2001 | Tang et al. | |
| 6,294,810 B1 | 9/2001 | Li et al. | |
| 6,320,788 B1 | 11/2001 | Sansbury et al. | |
| 6,385,000 B1 | 5/2002 | Ottesen et al. | |
| 6,385,090 B1 | 5/2002 | Kitazaki | |
| 6,452,835 B1 | 9/2002 | Diorio et al. | |
| 6,534,816 B1 | 3/2003 | Caywood | |
| 6,898,123 B2 * | 5/2005 | Owen | 365/185.21 |
| 6,909,389 B1 * | 6/2005 | Hyde et al. | 341/144 |
| 6,950,342 B2 | 9/2005 | Lindhorst et al. | |
| 7,046,549 B2 | 5/2006 | Lee et al. | |
| 2003/0206437 A1 | 11/2003 | Diorio et al. | |
| 2004/0004861 A1 | 1/2004 | Srinivas et al. | |
| 2004/0052113 A1 | 3/2004 | Diorio et al. | |
| 2004/0206999 A1 * | 10/2004 | Hyde et al. | 257/312 |

OTHER PUBLICATIONS

Diorio, "A p-Channel MOS Synapse Transistor with Self-Convergent Memory Writes", IEEE Transactions On Electron Devices, vol. 47, No. 2, pp. 464-472, Feb. 2000.

International Search Report for International Application No. PCT/US03/23724, dated mailed Jan. 20, 2004.

Lanzoni et al., "A Novel Approach to Controlled Programming of Tunnel-Based Floating-Gate MOSFET's", 1994, IEEE Journal of Solid-State Circuits, vol. 29, No. 2, pp. 147-150.

Partial International Search for International Application No. PCT/US03/31792, date mailed Apr. 2, 2004.

Chang, et al., "A CMOS-Compatible Single-Poly Cell for Use as Non-Volatile Memory", International Semiconductor Device Date Research Symposium, Dec. 1-3, 1999.

Ohsaki, et al., "A Single Poly EEPROM Cell Structure for Use in Standard CMOS Processes", IEEE Journal of Solid-State Circuits, vol. 29, No. 3, Mar. 1994, pp. 311-316.

* cited by examiner

COUNTERACTING OVERTUNNELING IN NONVOLATILE MEMORY CELLS USING CHARGE EXTRACTION CONTROL

CROSS-REFERENCE TO RELATED APPLICATION

This application is a continuation-in-part of U.S. patent application Ser. No. 10/245,183, entitled "Method and Apparatus for Preventing Overtunneling in pFET-Based Nonvolatile Memory Cells", filed on Sep. 16, 2002, now U.S. Pat. No. 6,853,583 in the name of the same inventors and commonly owned herewith.

FIELD OF THE INVENTION

The present invention relates generally to nonvolatile memory (NVM). More particularly, the present invention relates to methods of and apparatuses for preventing overtunneling in NVM memory cells.

BACKGROUND OF THE INVENTION

The demand for embedded nonvolatile memory (NVM) in integrated circuits has grown steadily over the past decade. Desirable characteristics of embedded NVM include low cost, low power, high speed, and high reliability (data retention and program/erase cycling endurance). NVM may be embedded in various integrated circuit (IC) technologies such as, for example, the widely used Complementary Metal Oxide Semiconductor (CMOS) technology. Some embedded CMOS applications include, for example, storing: (1) chip serial numbers, (2) configuration information in ASICs (Application Specific Integrated Circuits), (3) product data in radio frequency identification integrated circuits, (4) code or data in embedded microcontrollers, and (5) analog trim information.

A major barrier for using embedded NVM is cost. An IC fabricator typically requires additional processing steps to manufacture NVM storage transistors. For example, IC fabricators sometimes use two layers of polysilicon for the gate of an NVM storage transistor, rather than one layer as in standard CMOS technology. The additional fabrication step increases the total cost of the IC. Typical embedded EEPROM (electrically erasable programmable read only memory) or Flash NVM uses nFET (n-channel field effect transistor) storage transistors. To ensure charge retention in nFETs, the IC fabricator typically uses a thicker gate oxide than is found in logic transistors, again increasing cost.

To reduce the costs and added complexities of embedding NVM in integrated circuits, efforts have been made to design an NVM that can be integrated with CMOS process technology without introducing additional processing steps. These integration efforts have also involved endeavoring to use pFET-based NVM, rather than the more traditional nFETs-based NVM. The reason for this is that pFET-based memory cells exhibit various performance advantages compared to nFET-based memory cells. pFETs have the following advantages over their nFET-based NVM counterparts: 1) increased program/erase cycle endurance (due to reduced oxide wearout); 2) availability in logic CMOS processes (due to reduced memory leakage arising from more favorable oxide physics); 3) ability to easily store analog as well as digital values (due to precise memory writes); and 4) smaller on-chip charge pumps (due to decreased charge-pump current requirements).

Whether using pFETs or nFETs as NVM transistors, the possibility of "overtunneling" in either type of such cells poses a significant problem. The referred to "overtunneling" problem, in pFET-based memory cells for example, manifests itself as follows. Such cells use electron tunneling to raise the floating-gate voltage, and impactionized hot-electron injection (IHEI) to lower the floating-gate voltage. One characteristic of the IHEI programming method is that the MOSFET channel must be conducting current to allow electrons to inject onto the floating gate. If during a prior tunneling cycle the floating-gate voltage was raised so high that the pFET was turned off, there will be no channel current when a write to the cell is attempted. Effectively, by overtunneling the memory cell, the memory cell becomes "stuck" in an off state, and in the absence of channel current no electron injection can be performed during a programming (i.e. injection) cycle to lower the floating-gate voltage.

The overtunneling problem, at least as observed in pFET-based NVM cells, detracts from their use as reliable memory devices. Accordingly, there is a need for methods and apparatuses for preventing overtunneling in NVM cells.

BRIEF DESCRIPTION OF THE INVENTION

The invention overcomes the problems of the prior art. The invention provides memory devices having individual cells that can store data. An individual cell includes a circuit with a transistor that has a floating gate that stores charge, and a capacitor structure for extracting charge from the gate, such as by tunneling. A counteracting circuit prevents extracting charge from the floating gate beyond a threshold, therefore preventing overtunneling or correcting for it. In one embodiment, the counteracting circuit supplies electrons to the floating gate, to compensate for tunneling beyond a point. In another embodiment, the counteracting circuit includes a cutoff switch, and a sensor to trigger the cutoff switch when the appropriate threshold is reached. The cutoff switch may be arranged in any number of suitable ways, such as to prevent a high voltage from being applied to the capacitor structure, or to prevent a power supply from being applied to a terminal of the transistor or to a well of the transistor.

These and other aspects and advantages of the invention are described in more detail with reference to the remaining portions of the specification and the attached drawings.

DETAILED DESCRIPTION

Embodiments of the present invention are described herein in the context of methods and apparatuses for preventing overtunneling in pFET-based nonvolatile memory cells. Those of ordinary skill in the art will realize that the following detailed description of the present invention is illustrative only and is not intended to be in any way limiting. Other embodiments of the present invention will readily suggest themselves to such skilled persons having the benefit of this disclosure.

Reference will now be made in detail to implementations of the present invention as illustrated in the accompanying drawings. The same reference indicators will be used throughout the drawings and the following detailed description to refer to the same or similar parts.

In general, the invention provides memory devices having individual cells that can store data. An individual cell includes a circuit with a transistor that has a floating gate that stores charge, and a capacitor structure for extracting charge from the gate, such as by tunneling. The transistor may be a pFET injection transistor, or an nFET transistor. There is a large variety of cells covered under the invention, for example where a coupling capacitor is coupled between the floating gate and a source of the injection transistor, or an additional transistor is provided, and so on. The capacitor structure may advantageously be made from a MOSFET structure, in association with making the transistor.

Importantly, the invention also includes a counteracting circuit, to prevent extracting charge from the floating gate beyond a threshold. As will be seen below, the threshold may be a preset amount of charge, a preset electrical potential, or a preset amount of electrical current. The preset amount of electrical current may be associated with a minimum channel current required to maintain a conducting channel in the transistor. The invention will now be described in more detail.

Figure 1:
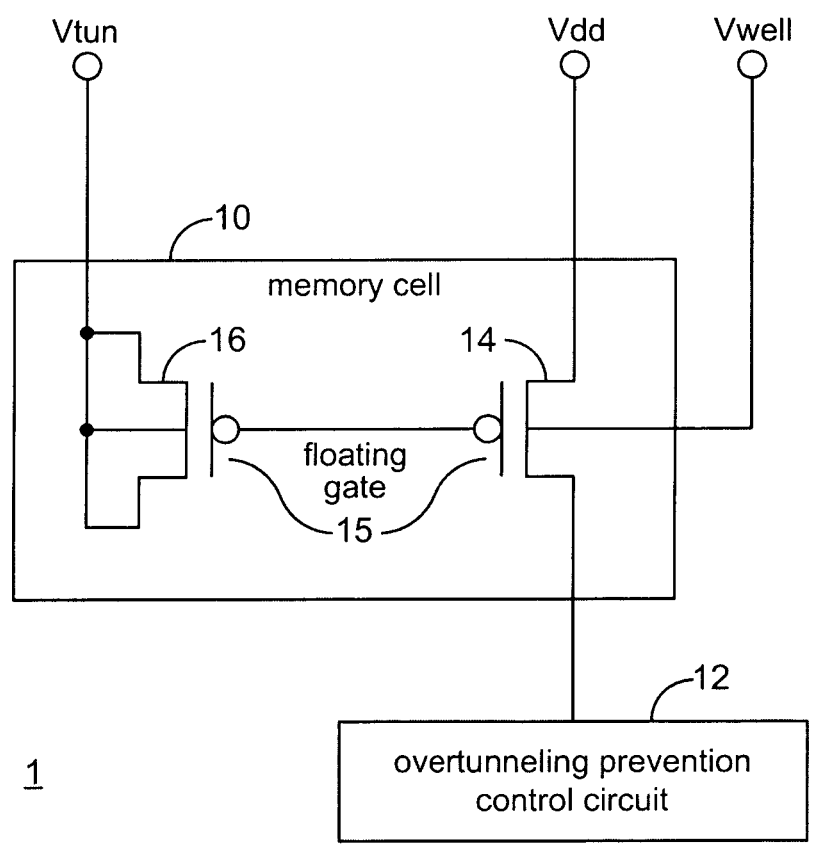
FIG. 1 shows a memory circuit for preventing overtunneling in a pFET-based memory cell, according to an embodiment of the present invention.

Referring first to FIG. 1, there is shown a memory circuit 1 for preventing overtunneling in a pFET-based memory cell, according to an embodiment of the present invention. Memory circuit 1 comprises a memory cell 10 and a counteracting circuit implemented as an overtunneling prevention control circuit 12. Memory cell 10 comprises an injection transistor 14 and a tunneling capacitor 16. Injection transistor 14 has a floating gate 15, a source coupled to a voltage source Vdd, a body coupled to a well voltage source Vwell, and a drain coupled to overtunneling prevention control circuit 12. As shown, tunneling capacitor 16 is formed from a pFET, with the source, drain and body of the pFET shorted together and coupled to a tunneling voltage source Vtun. However, a tunneling capacitor constructed from other structures such as, for example, an nFET can also be used. The gate of tunneling capacitor 16 is coupled to the floating gate 15 of injection transistor 14.

In one embodiment of the invention, the counteracting circuit is adapted to add charge to the gate. This way, while tunneling may continue, electrons being added prevent the state of overtunneling from taking place. The counteracting circuit may be coupled to a drain of the transistor, and includes a source of electrons, as will be described in more detail below.

Figure 2:
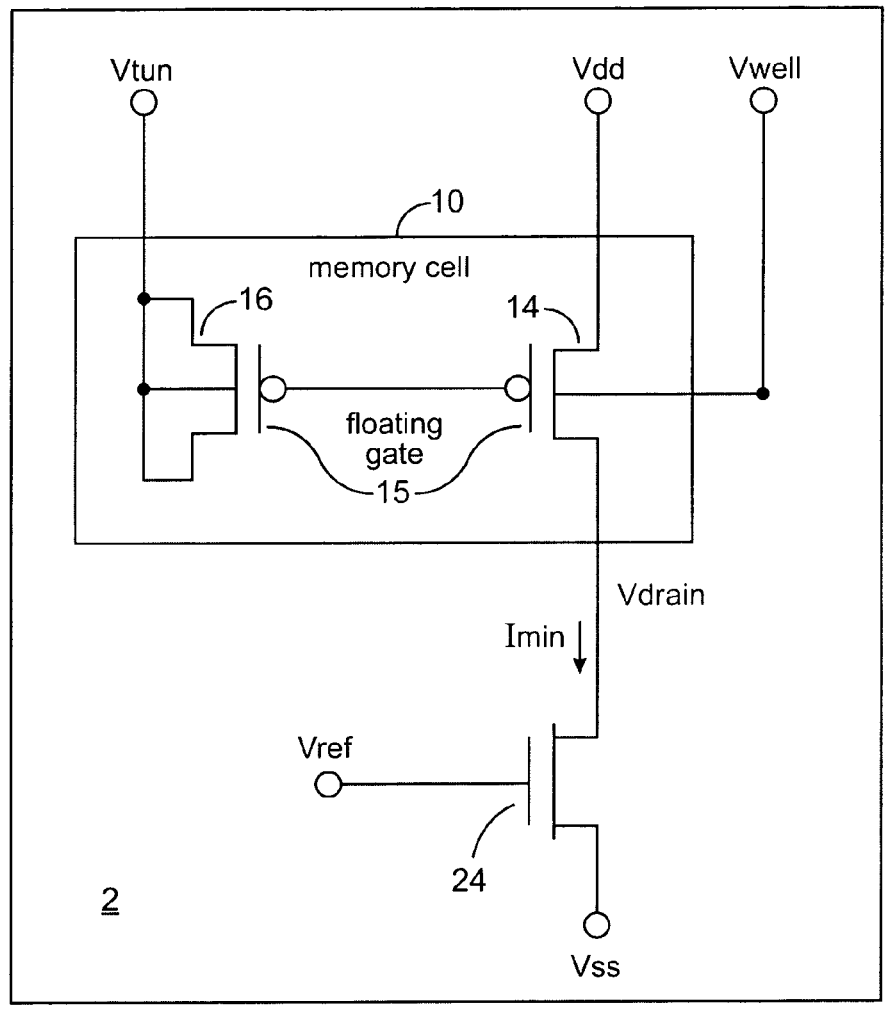
FIG. 2 shows another memory circuit for preventing overtunneling in a pFET-based memory cell, according to an embodiment of the present invention.

FIG. 2 shows a memory circuit 2 for preventing overtunneling in a pFET-based memory cell, according to an embodiment of the present invention. Similar to the embodiment in FIG. 1, the memory circuit 2 comprises a memory cell 10 having an injection transistor 14 and a tunneling capacitor 16. Memory circuit 2 also includes an nFET (i.e.

an n-channel MOSFET) overtunneling prevention transistor 24 having a drain coupled to the drain of injection transistor 14, a source coupled to a negative supply voltage Vss, and a gate coupled to a reference voltage Vref.

Memory circuit 2 in FIG. 2 operates as follows. Assume the voltage on the floating gate 15 is low, and it is desired to tunnel it up. To tunnel up floating gate 15 a tunnel voltage Vtun of about (Vfg+10V), where Vfg is the floating gate voltage and 10V is typical for a 0.35 μm CMOS process with 75 Å oxides, is applied to the tunneling capacitor 16. Vtun causes electrons to tunnel from floating gate 15, through the tunneling capacitor's dielectric (i.e., the gate oxide, if tunneling capacitor is formed from a pFET or an nFET), to Vtun, thereby raising Vfg. To prevent overtunneling, a reference voltage Vref is applied to the gate of overtunneling prevention transistor 24. Overtunneling prevention transistor 24 operates by sinking a small current Imin (e.g. ~250 nA) from injection transistor 14. As long as injection transistor 14 is able to source more current than overtunneling prevention transistor 24 sinks, Vdrain remains high, and injection transistor 14 will not inject electrons onto floating gate 15. When, however, Vfg rises so high that injection transistor 14 can no longer source Imin, Vdrain will fall, causing injection transistor 14 to begin injecting electrons onto floating gate 15. Eventually, Vdrain will stabilize at a voltage where the IHEI gate current is equal and opposite to the tunneling gate current. Hence, overtunneling prevention transistor 24 prevents injection transistor 14 from turning off by injecting electrons back onto floating gate 15, thereby forcing the channel current of injection transistor 14 to maintain a value equal to Imin.

Figure 3B:
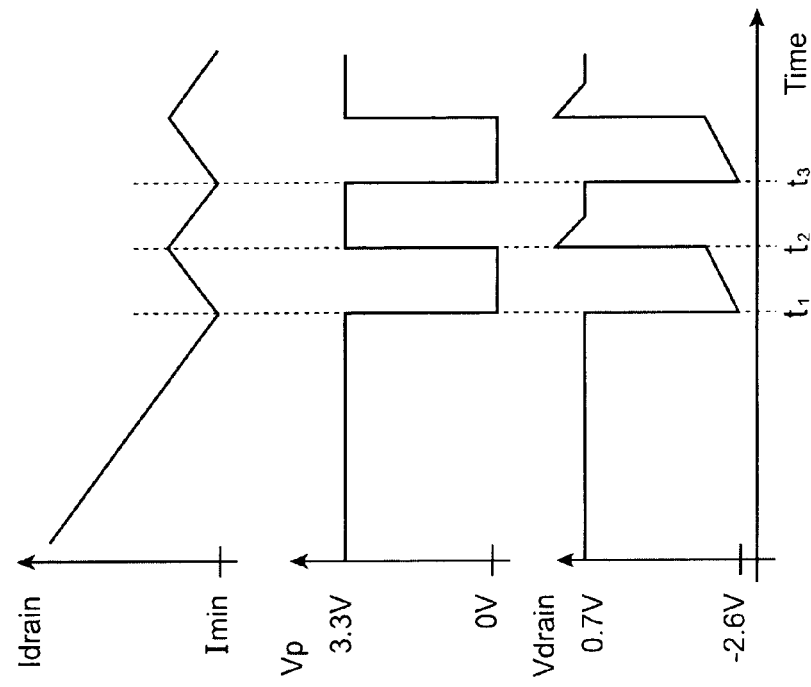
FIG. 3B shows a timing diagram illustrating the operation of the memory circuit in FIG. 3A, according to an embodiment of the present invention.
Figure 3A:
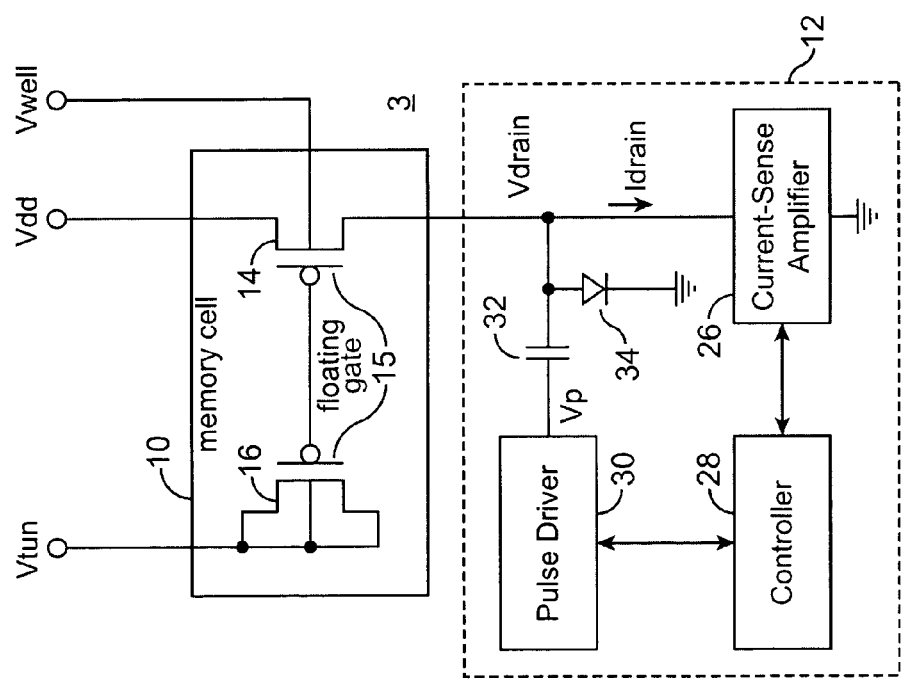
FIG. 3A is shows yet another memory circuit for preventing overtunneling in a pFET-based memory cell, according to an embodiment of the present invention.

In 0.35 μm and smaller CMOS logic processes, a voltage of not more than about 12V can be applied to the body of tunneling capacitor 16, without risking body-to-substrate breakdown. Because a voltage of ~10V is needed across the gate oxide of tunneling capacitors 16 to cause appreciable electron tunneling, Vfg must be roughly (12V−10V)=2V. To obtain channel currents in the range of 10 nA to 10 μA, Vdd should then be ~3.3V. To obtain reasonable IHEI in injection transistor 14, Vdrain should be ~−2V, meaning Vss should be ~−2.5V. Unfortunately, most modern n-well CMOS processes do not offer nFETs that operate with a Vss of more than a few hundred millivolts below ground, because the nFET's substrate-to-source and substrate-to-drain p-n junctions become forward biased. If such limitations are encountered, other embodiments of the present invention may be used. One alternative embodiment is to use a deep n-well or a dual-well process and fabricate an overtunneling prevention transistor, like transistor 24 shown in FIG. 2, in a p-well that can be biased ~2.5V below ground. A second alternative embodiment is to provide an overtunneling prevention control circuit to emulate the functions of the overtunneling prevention transistor 24 without having to resort to additional processing steps necessary to create a p-well operating below ground. FIG. 3A shows an example of the latter alternative, in accordance with an embodiment of the present invention.

In another embodiment of the invention, a counteracting circuit includes a current sensor to monitor a drain current of the memory cell and to generate a trigger event when the threshold is reached, and a pulse driver to add charge to the gate responsive to the trigger event. In this case, the threshold may be a preset amount of electrical current, which may be associated with a minimum channel current required to maintain a conducting channel in the transistor.

Referring to FIG. 3A, there is shown a memory circuit 3 for preventing overtunneling in a pFET-based memory cell, according to an embodiment of the present invention. Memory circuit 3 comprises a memory cell 10 having an injection transistor 14 and a tunneling capacitor 16, which may be formed from a pFET transistor as shown. The drain of injection transistor 14 is coupled to an overtunneling prevention control circuit 12, which comprises a current sensor. The current sensor includes a current sense amplifier 26, and a controller 28 coupled to current sense amplifier 26 that outputs a control signal. Circuit 12 also includes a pulse driver 30 coupled to controller 28, a capacitor 32 coupled between pulse driver 30 and the drain of injection transistor 14 and a diode 34 coupled between the drain of injection transistor 14 and ground.

Memory circuit 3 in FIG. 3A operates as follows. During tunneling, current sense amplifier 26 monitors the drain current Idrain of injection transistor 14. Tunneling causes Idrain to initially gradually decrease, as shown in the timing diagram provided in FIG. 3B. Current sense amplifier 26 is configured to trigger when Idrain decreases to a value of Imin. When current sense amplifier 26 triggers, controller 28 instructs pulse driver 30 to pull Vp from Vdd (nominally 3.3V) down to ground. This is indicated in FIG. 3B as occurring at time t1. Capacitor 32 then pulls the drain voltage Vdrain of injection transistor 14 from 0.7V (the "on" voltage of diode 34) to −2.6V, causing electron injection to commence in injection transistor 14, and thereby causing Idrain to increase. After a short period of time, at time t2 controller 28 instructs pulse driver 30 to pull Vp from ground back up to Vdd, and waits for current sense amplifier 26 to trigger again. In this fashion overtunneling prevention control circuit 12 pulses Vdrain as needed to ensure that injection transistor 14 is not overtunneled into an "off" state. Note that, although a "current sense" amplifier is employed to determine when Vdrain must be pulsed low to avoid overtunneling, other sensing or monitoring devices and circuits may be used. For example, the cell current maybe supplied to any one of many possible current-to-voltage circuit elements (e.g. resistor, diode, current source, etc) so that a voltage is measured and/or monitored, rather than transistor 14's drain current itself.

Figure 4:
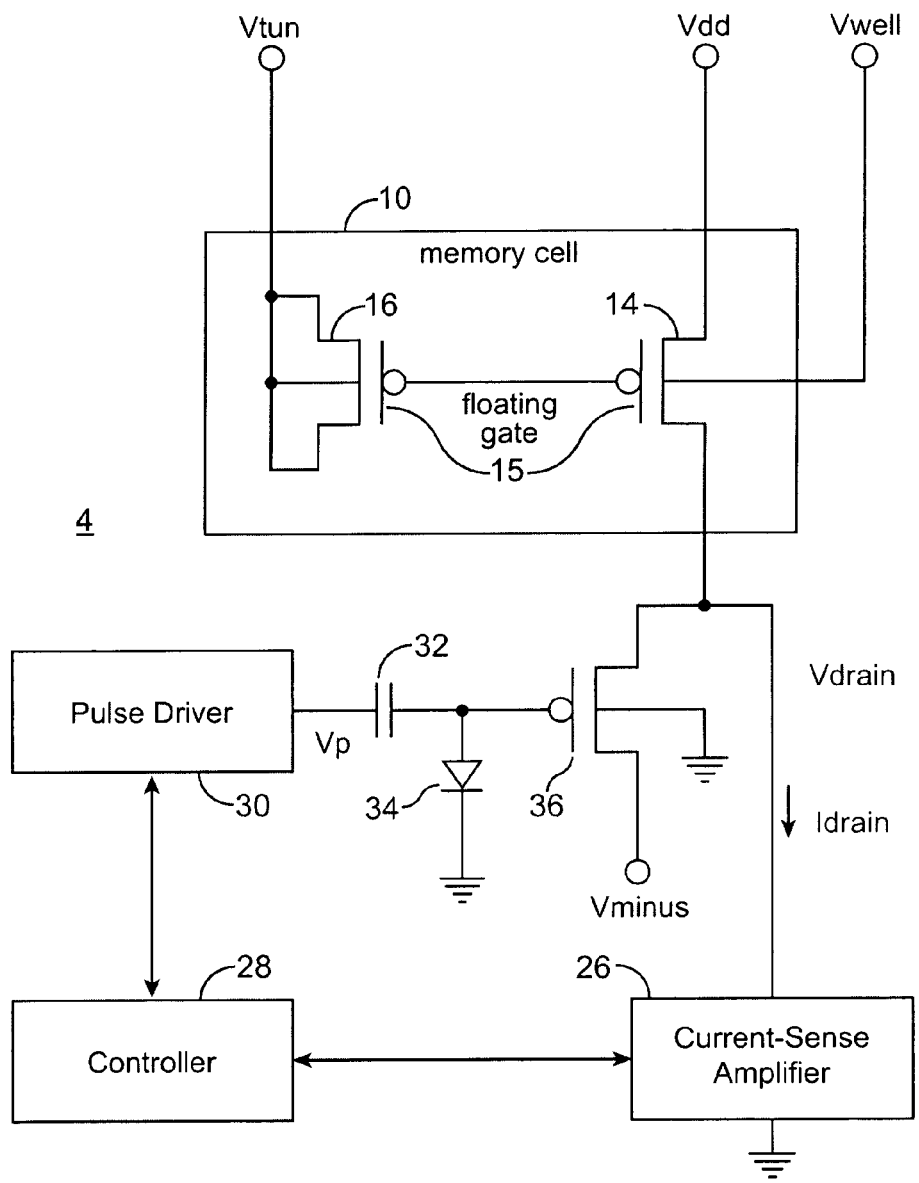
FIG. 4 shows the memory circuit of FIG. 3A, modified to take advantage of an available negative voltage source, according to an embodiment of the present invention.

FIG. 4 shows the memory circuit of FIG. 3A, modified to take advantage of an available negative voltage source Vminus, which would nominally be about −3.3V in a 0.35 μm CMOS process, according to an embodiment of the present invention. Memory circuit 4 in FIG. 4 comprises essentially the same elements as in memory circuit 3 of FIG. 3A, but also includes a source-follower-connected pFET 36 configured to operate as a negative-voltage switch. In one embodiment, Vminus may be provided by an off-chip voltage source. In an alternative embodiment, Vminus may be generated on the same semiconductor chip shared by memory cell 10 by using, for example, a negative-voltage charge pump. Source-follower-connected transistor 36 forms a negative-voltage switch as follows. When pulse driver 30 pulls Vp from Vdd (e.g. 3.3V) to ground and the gate of source-follower-connected transistor 36 is pulled to about −2.6V, the source of source-follower-connected transistor 36, and with it Vdrain, gets pulled down to about −2V.

Figure 5:
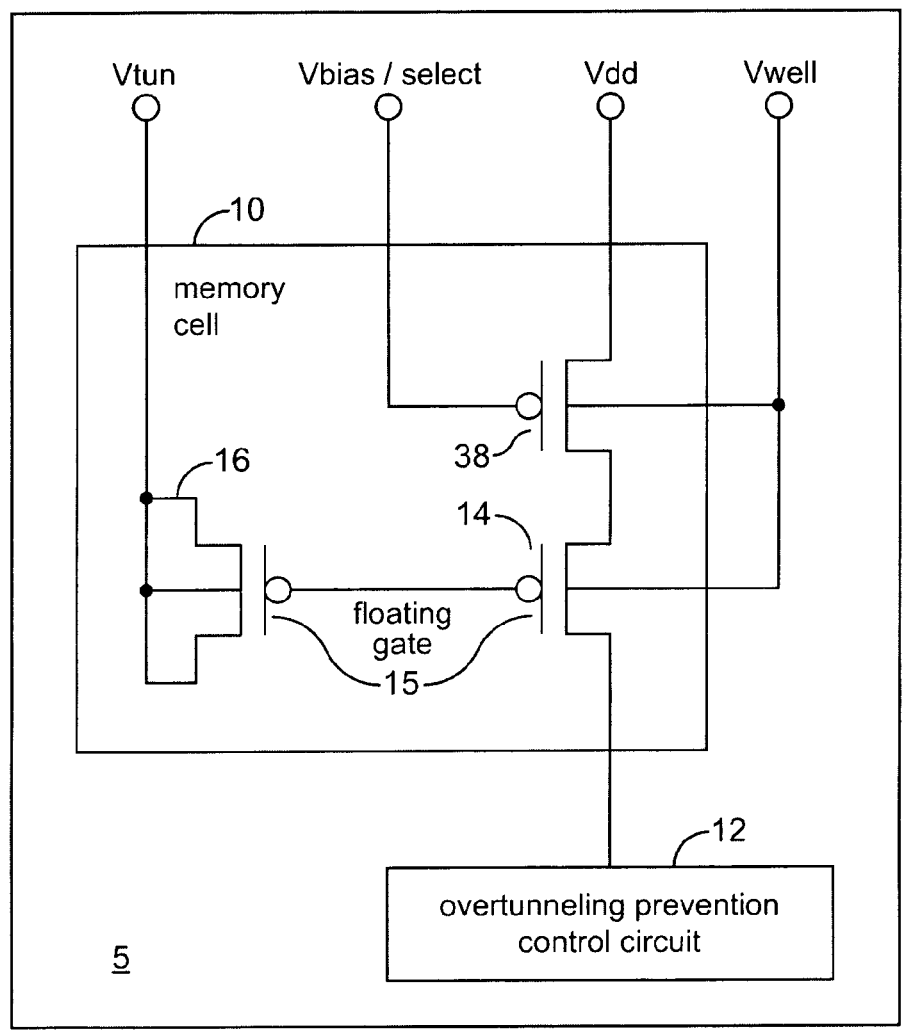
FIG. 5 shows the memory circuit of FIG. 1, modified so that it includes a select/bias transistor, according to an embodiment of the present invention.

FIG. 5 shows the memory circuit of FIG. 1, modified so that it includes a select/bias transistor 38 comprising a pFET, according to an embodiment of the present invention. Select/bias transistor 38 has a gate selectively coupled to a Vbias/select voltage source, a source coupled to Vdd, a drain coupled to the source of injection transistor 14, and a well coupled to voltage source Vwell. Select/bias transistor 38 in memory circuit 5 may be used to select memory cell 10 for injection (e.g. from among an array of memory cells) by controlling the current in injection transistor 14, and/or to limit the current in injection transistor 14 during other operations such as reading, for example.

Figure 6:
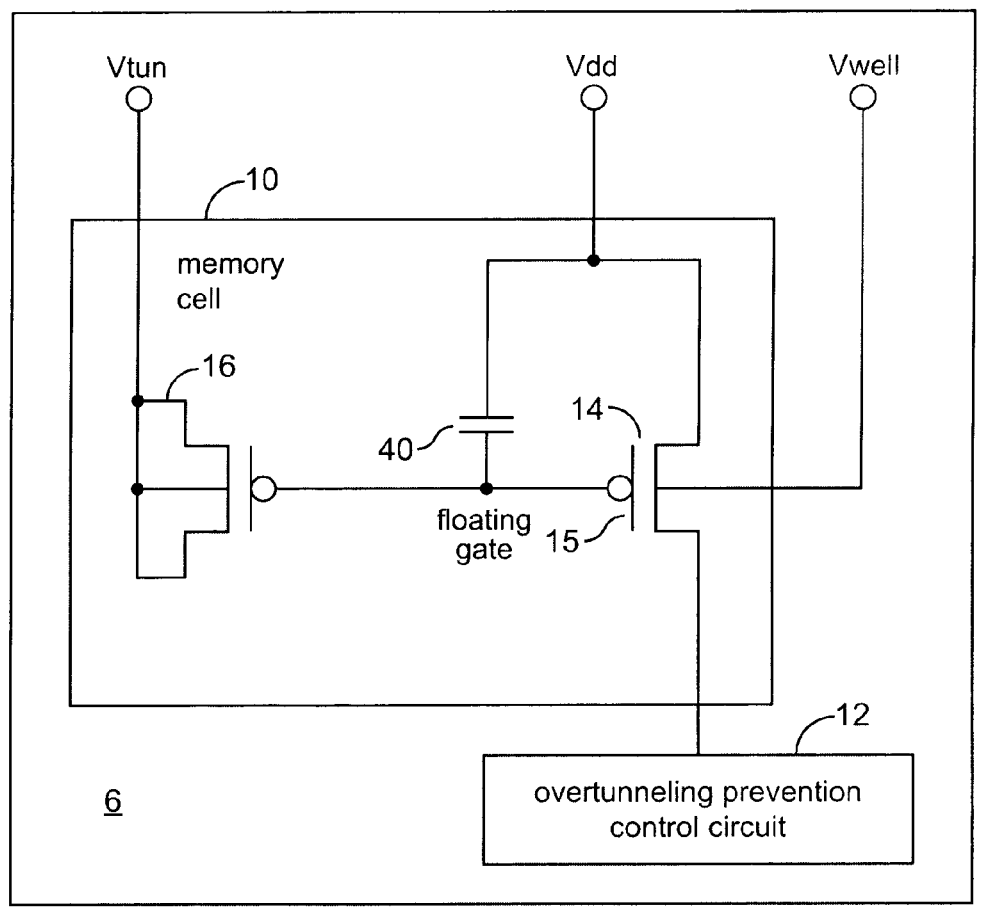
FIG. 6 shows the memory circuit of FIG. 1, modified so that it includes a capacitor coupled between the floating gate of the memory cell and a voltage source Vdd, according to an embodiment of the present invention.

FIG. 6 shows the memory circuit of FIG. 1, modified so that it includes a capacitor 40 coupled between floating gate 15 of memory cell 10 and voltage source Vdd, according to an embodiment of the present invention. Capacitor 40 of memory circuit 6 may be used to ensure that, when Vdd is pulled low, the floating gate follows.

Figure 7:
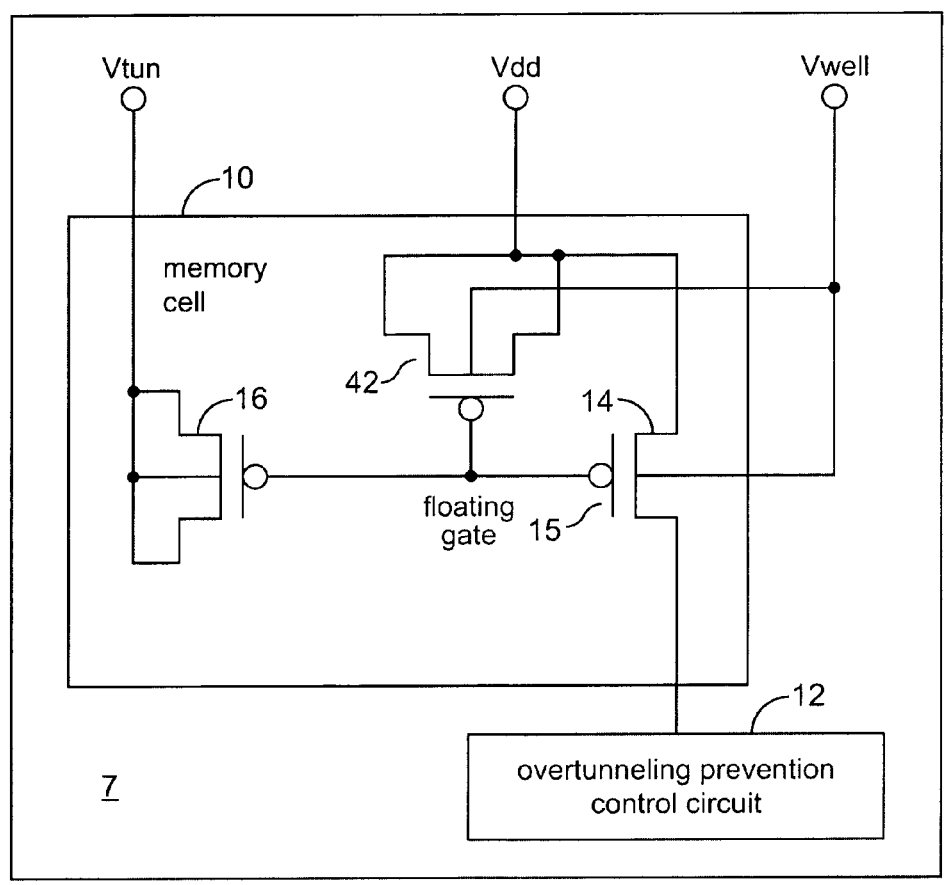
FIG. 7 shows how the capacitor in the memory circuit shown in FIG. 6 may be formed from a pFET configured as a MOS capacitor (MOSCAP), according to an embodiment of the present invention.

FIG. 7 shows how capacitor 40 in memory circuit 6 in FIG. 6 may be formed from a pFET 42 configured as a MOS capacitor (MOSCAP), according to an embodiment of the present invention. pFET 42 of memory circuit 7 has a gate coupled to floating gate 15, a source, a drain shorted to the source and coupled to voltage source Vdd, and a body coupled to the body of injection transistor 14 and to a well voltage source Vwell.

Figure 8:
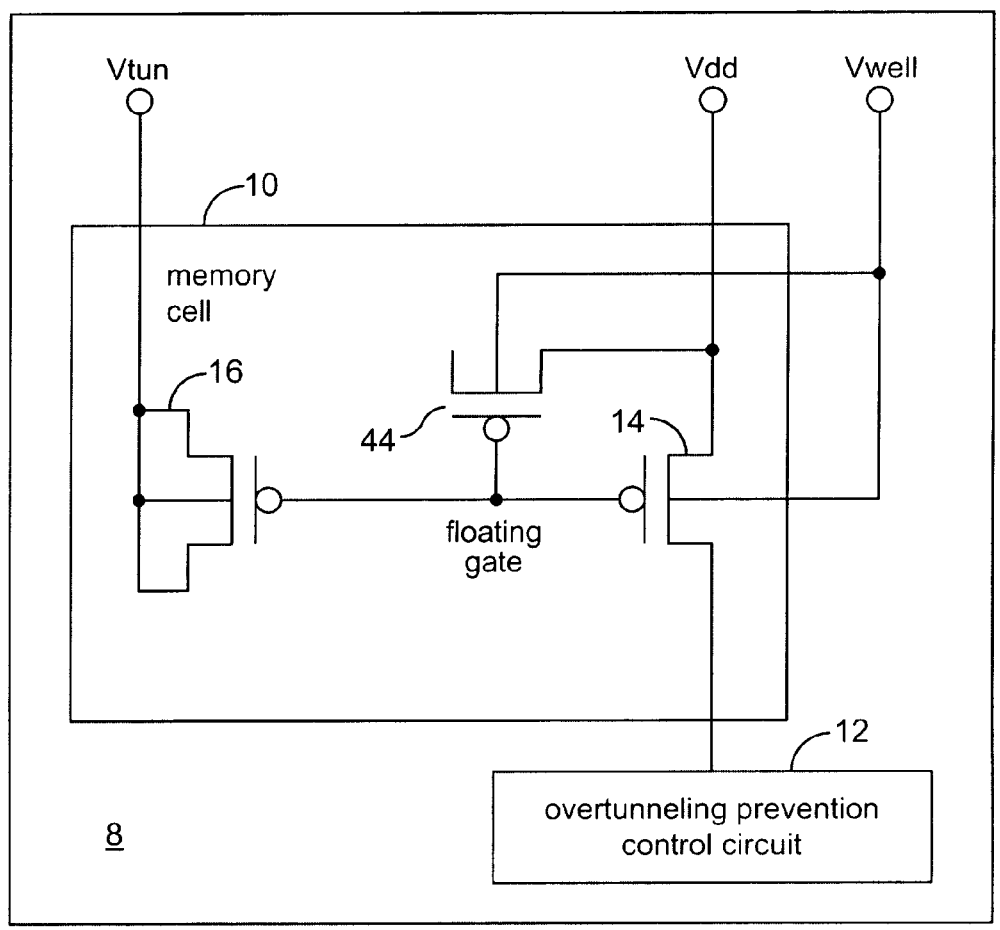
FIG. 8 shows how the capacitor in the memory circuit shown in FIG. 6 may be formed from half of a pFET configured as a MOSCAP, according to an embodiment of the present invention.

FIG. 8 shows how capacitor 40 in memory circuit 6 in FIG. 6 may be formed from half of a pFET 44 configured as a MOSCAP, according to an embodiment of the present invention. Half pFET 44 may be constructed from, for example, a pFET with either the drain or source terminal left floating, or a pFET having either a drain or source terminal but not both. The latter embodiment saves layout area of the integrated circuit on which memory circuit 8 is formed.

Figure 9:
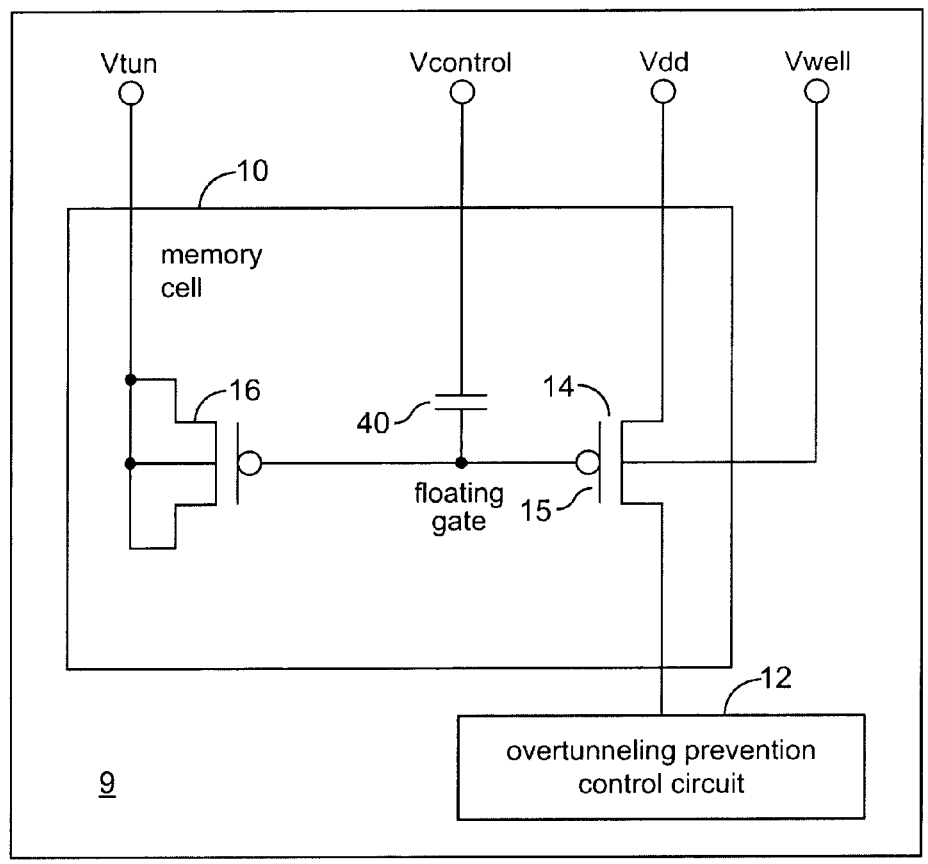
FIG. 9 shows the memory circuit of FIG. 6, modified so that the added capacitor is coupled to a control source Vcontrol, rather than Vdd, according to an embodiment of the present invention.

FIG. 9 shows the memory circuit 6 of FIG. 6, modified so that capacitor 40 is coupled to a control source Vcontrol, rather than Vdd, according to an embodiment of the present invention. This alternative connection allows the independent control of Vdd and the floating-gate voltage Vfg. Capacitor 40 can be constructed from a pFET or from half of a pFET, as described in FIGS. 7 and 8. Additionally, capacitor 40 may be formed in the same n-well as injection transistor 104, or in a separate n-well.

Figure 10:
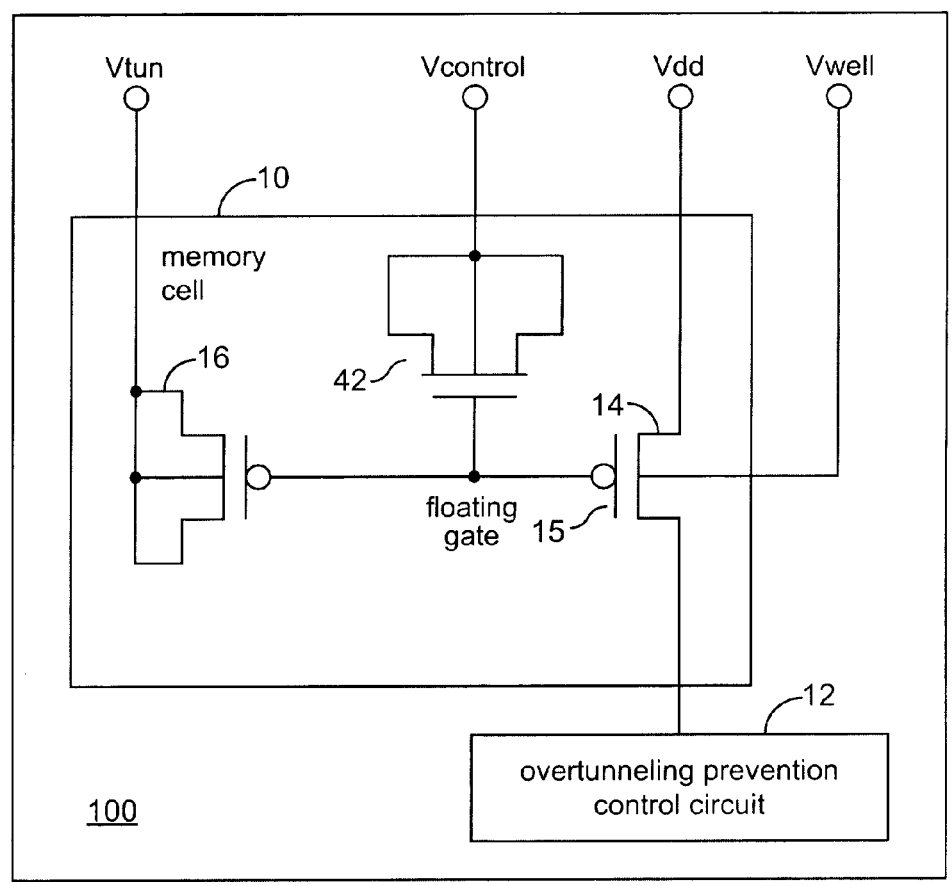
FIG. 10 shows a memory circuit similar to the memory circuit of FIG. 9, where the added capacitor is formed from an nFET, according to an embodiment of the present invention.

FIG. 10 shows a memory circuit 100 similar to the memory circuit 9 of FIG. 9, where capacitor 40 in FIG. 9 is formed from an nFET 42, according to an embodiment of the present invention. As shown in FIG. 10, nFET 42 is configured as a MOSCAP, having a gate coupled to floating gate 15 and shorted source, drain and body terminals coupled to the control source Vcontrol. In various alternative embodiments, nFET 42 may be formed with no drain or source terminal, with either a drain terminal or a source terminal but not both, or with both a drain terminal and a source terminal.

Figure 11:
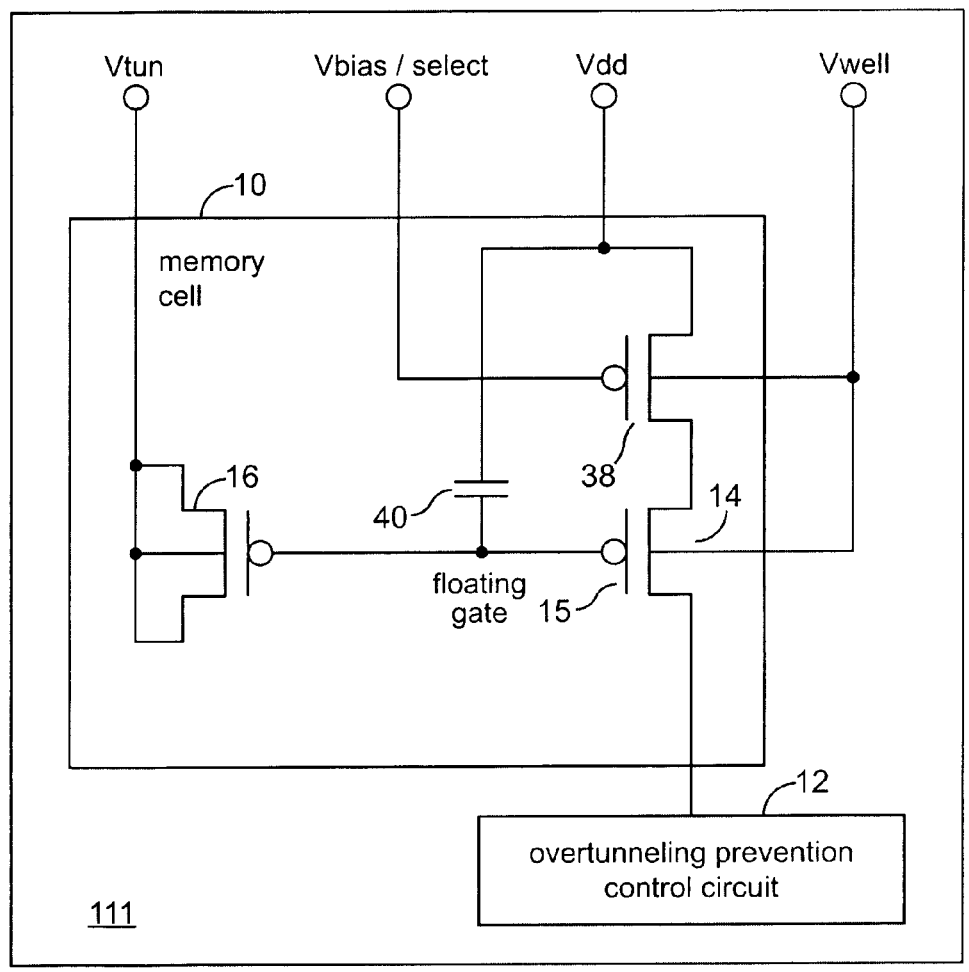
FIG. 11 shows a memory circuit that includes both a select/bias transistor similar to that shown in the memory circuit in FIG. 5 and a capacitor similar to that shown in the memory circuit in FIG. 6, according to an embodiment of the present invention.

FIG. 11 shows a memory circuit 111 that includes the select/bias transistor 38 of memory circuit 5 in FIG. 5 and the capacitor 40 of memory circuit 6 in FIG. 6, according to an embodiment of the present invention. Capacitor 40 may comprise any of the forms described above and may connect to either Vdd or a separate control input.

In another embodiment, the counteracting circuit includes a cutoff switch, and a sensor to trigger the cutoff switch when the appropriate threshold is reached. The cutoff switch may be arranged in any number of suitable ways, such as to prevent a high voltage from being applied to the capacitor structure, or to prevent a power supply from being applied to a terminal of the transistor or to a well of the transistor. The sensor may be the same as was described in connection with FIG. 3A. In addition, if in the particular implementation overtunneling is permitted to take place initially, additional structure may be provided to supply electrons back to the floating gate.

Figure 12B:
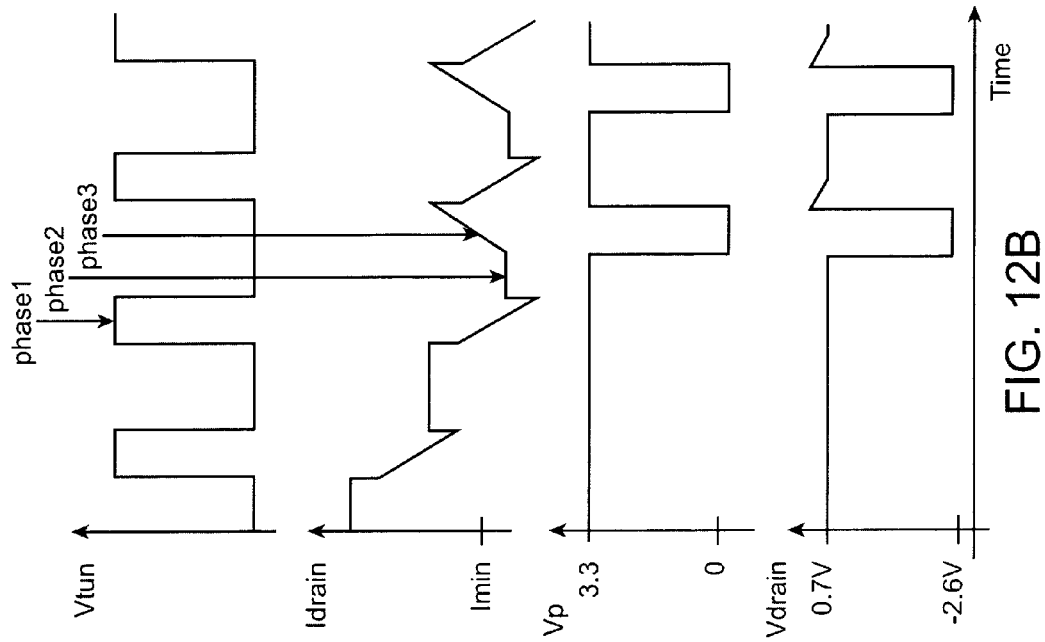
FIG. 12B shows a timing diagram illustrating the operation of the memory circuit in FIG. 12A, according to an embodiment of the present invention.
Figure 12A:
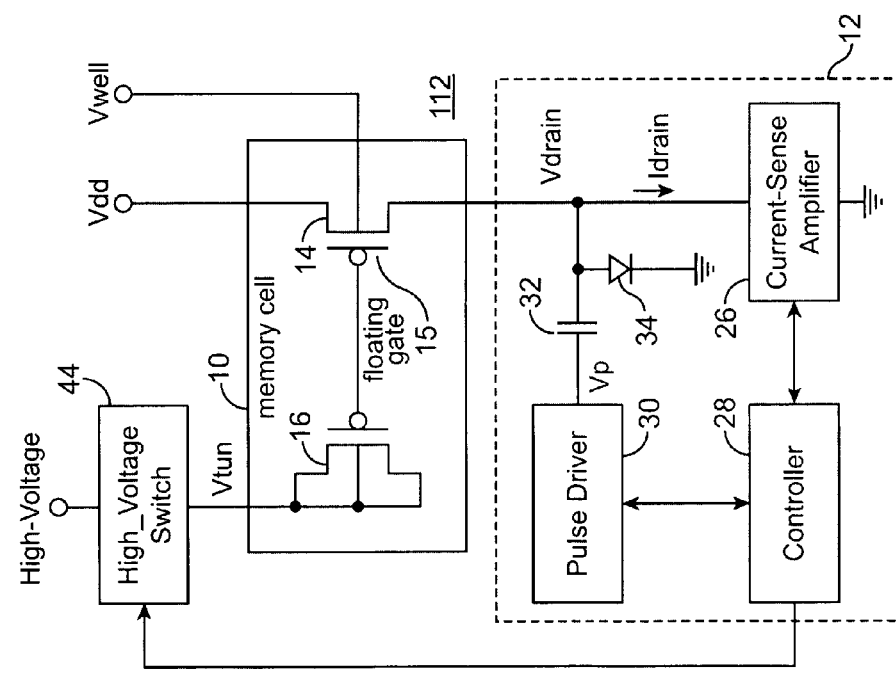
FIG. 12A shows a memory circuit similar to the memory circuit in FIG. 3A, including a high-voltage switch, according to an embodiment of the present invention.

FIG. 12A shows a memory circuit 112 similar to the memory circuit in FIG. 3A, including a cutoff switch implemented as high-voltage switch 44, according to an embodiment of the present invention. High-voltage switch 44, as controlled by controller 28, is opened to prevent tunneling during times when memory cell 10 is being sensed or when charge carriers are being injected onto floating gate 15. High-voltage switch 44 prevents tunneling during sense and inject operations to avoid capacitive coupling between tunneling capacitor 16 and floating gate 15. Capacitive coupling undesirably causes floating gate 15 to be pulled high during tunneling, artificially decreasing the drain current Idrain of injection transistor 14 as shown in the timing diagram provided in FIG. 12B. To read the drain current Idrain accurately, tunneling must first be terminated. Memory circuit 112, including overtunneling prevention control circuit 12 and high-voltage switch 44 performs the following sequence of operations as illustrated in the timing diagram shown in FIG. 12B. During phase 1 a positive-going tunneling pulse is applied to tunneling capacitor 16. Next, during phase 2 controller 28 causes high-voltage switch 44 to open to turn off tunneling. During phase 2, Idrain is measured by sense amplifier 26. Finally, during phase 3, if Idrain is smaller than a predetermined minimum drain current Imin, controller 28 causes pulse driver 30 to pulse, thereby lowering the drain voltage Vdrain of inject transistor 14. The lowering of Vdrain causes inject transistor 14 to begin injecting charge carriers onto floating gate 15.

Figure 13:
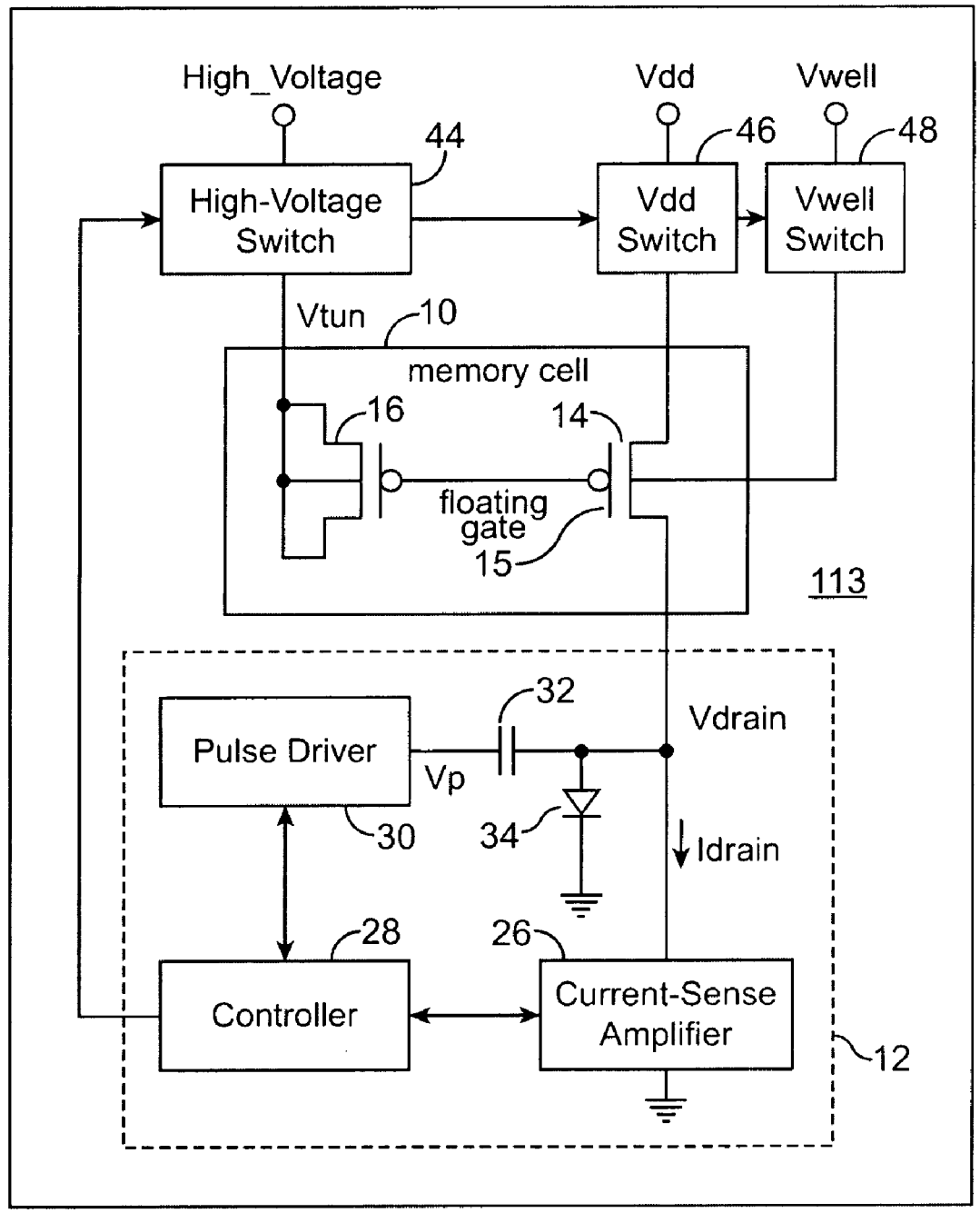
FIG. 13 shows a memory circuit similar to the memory circuit in FIG. 12A, including a Vdd switch and a Vwell switch, according to an embodiment of the present invention.

FIG. 13 shows a memory circuit 113 similar to the memory circuit in FIG. 12A, including cutoff switches implemented as a Vdd switch 46 and a Vwell switch 48, according to an embodiment of the present invention. This alternative embodiment may be used to decouple Vdd and Vwell from memory cell 10 or to set them to a low voltage such as ground during tunneling, to capacitively couple floating gate 15 down by a volt or more and thereby reduce the required tunneling voltage Vtun by this same volt or more.

Figure 14:
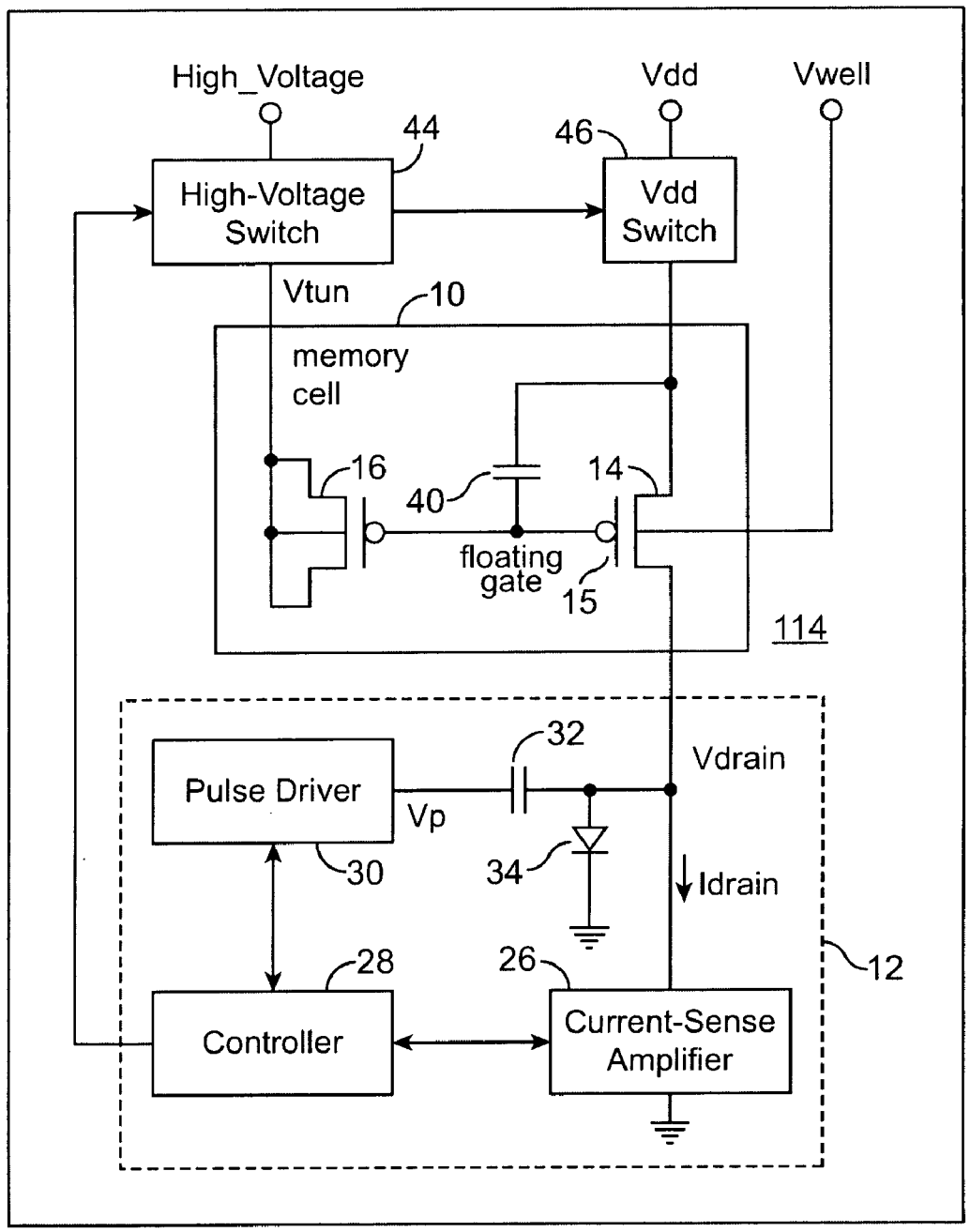
FIG. 14 shows a memory circuit, including capacitor similar to the added capacitor in the memory circuit in FIG. 6, according to an embodiment of the present invention.

FIG. 14 shows a memory circuit 114, including the capacitor 40 in memory circuit 6 of FIG. 6, according to an embodiment of the present invention. Because capacitor 40 provides significant capacitive coupling between Vdd and floating gate 15, there is less need to switch Vwell down to ground during tunneling. (Capacitor 40 effectively replaces the parasitic well-to-floating-gate capacitance of injection transistor 14.) Consequently, the Vwell switch in the embodiment shown in FIG. 13 is not required. Those skilled in the art will readily understand that many other combinations of switches and memory cells are possible.

Figure 15B:
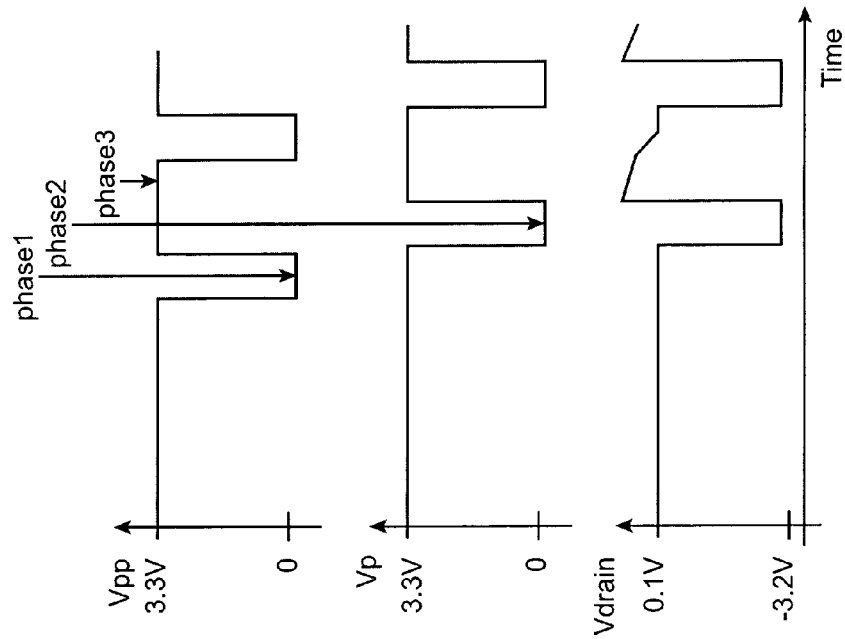
FIG. 15B shows a timing diagram of the operation of the memory circuit in FIG. 15A, according to an embodiment of the present invention.
Figure 15A:
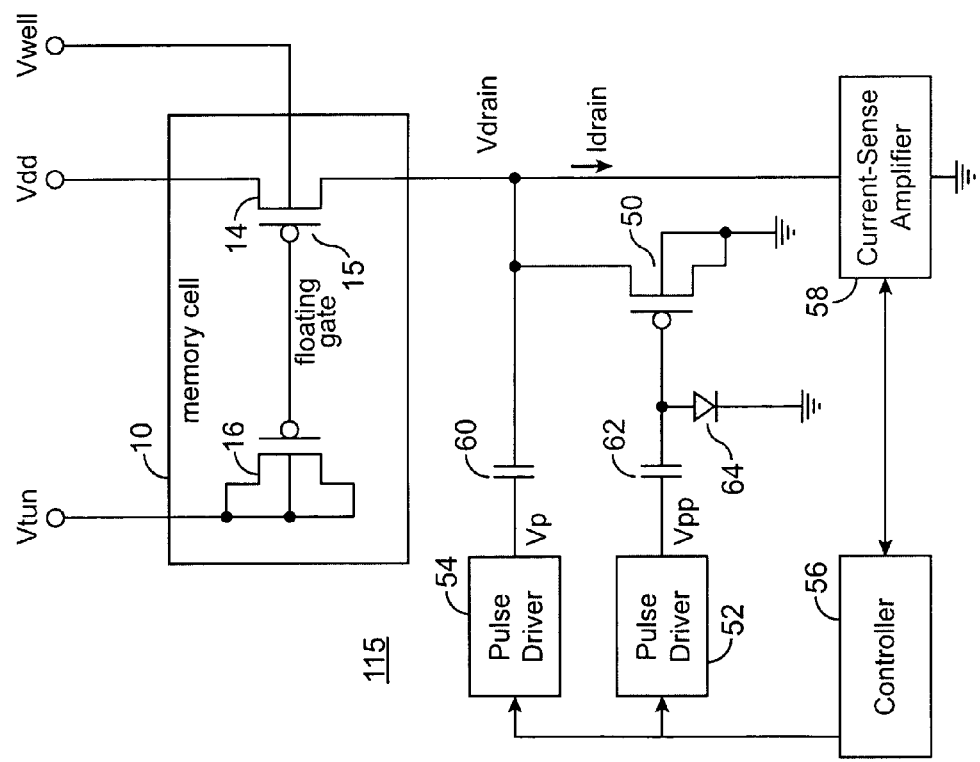
FIG. 15A shows a memory circuit employing a source-follower-connected pFET and an additional pulse driver, according to an embodiment of the present invention.

FIG. 15A shows a memory circuit 115 employing a source-follower-connected pFET 50 and an additional pulse driver 52, according to an embodiment of the present invention. Pulse drivers 52 and 54 are controlled by a controller 56, which is coupled to a current sense amplifier 58. A first capacitor 60 is coupled between pulse driver 54 and the drain of injection transistor 14. A second capacitor 62 is coupled between pulse driver 52 and the gate of pFET 50. The source of pFET 50 is coupled to the drain of injection transistor 14 and the source and body of pFET 50 are shorted together and coupled to ground. A diode 64 is coupled between the gate of pFET 50 and ground. The use of source-follower-connected transistor 50 allows a lower drop in the drain voltage Vdrain to be realized, compared to some of the previous embodiments described above. The reason for this is that the saturated drain voltage of source-follower-connected transistor 50 can be 100 millivolts or less, whereas the "on-voltage" of diode 34 in the previous embodiments is closer to 700 millivolts. With this difference, Vdrain transitions from 0.1V to −3.2V during an injection cycle rather than from 0.7V to −2.6V. Because IHEI increases exponentially with drain-to-gate voltage, memory circuit 115 has more efficient injection compared with, for example, memory circuit 3 in FIG. 3A.

FIG. 15B shows a timing diagram of the operation of memory circuit 115 in FIG. 15A. During phase 1 Vpp transitions from 3.3V to ground, pulling the gate of source-follower-connected transistor 50 to ~2.6V below ground, thereby turning source-follower-connected transistor 50 on and pulling Vdrain close to ground (limited only by the saturation voltage of source-follower-connected transistor 50). During phase 2 Vpp transition from ground to 3.3V, returning the gate of transistor 50 back to ~0.7V and discharging any accumulated charge on capacitor 62 through diode 64; also, Vp transitions from 3.3V to ground, pulling Vdrain from ~0.1V to −3.2V and causing injection transistor 14 to inject. During phase 3 Vp transitions from ground to 3.3V, thereby turning off injection.

Figure 16:
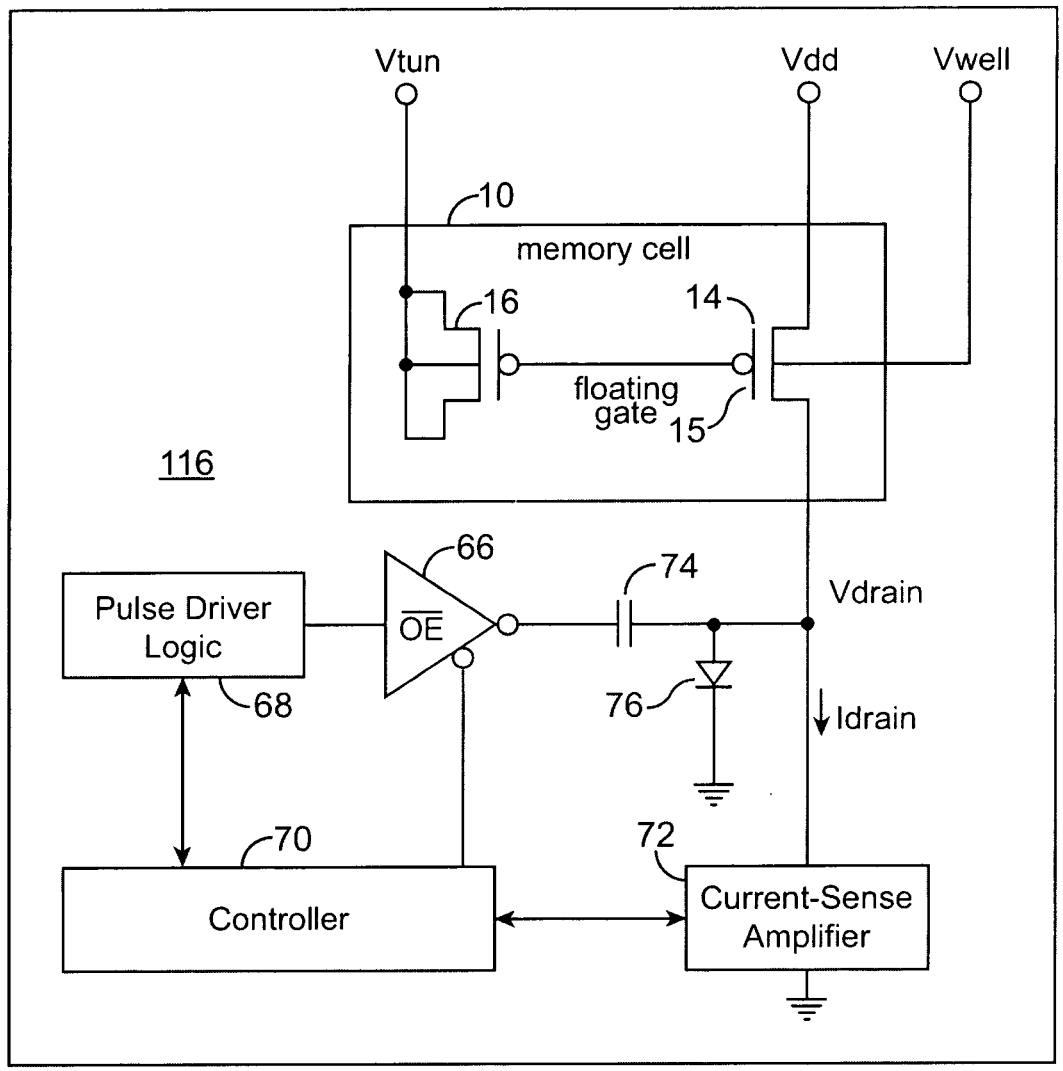
FIG. 16 shows the memory circuit of FIG. 3A, modified so that it includes a tristate logic gate, according to an embodiment of the present invention.

FIG. 16 shows the memory circuit of FIG. 3A, modified so that it includes a tristate logic gate 66, according to an embodiment of the present invention. Tristate logic gate 66 of memory circuit 116 is driven by pulse driver logic 68, which is controlled by a controller 70. Similar to the previous embodiments, drain current of injection transistor 14 is monitored by a current sense amplifier 72. A capacitor 74 is coupled between tristate logic gate 66 and the drain of injection transistor 14 and a diode 76 is coupled between the drain of injection transistor 14 and ground. As shown, tristate logic gate 66 is an inverter. However, alternative logic gates with tristate outputs may also be used (e.g., such as NANDs or NORs). A benefit of a tristated output is that it reduces the capacitive load presented by capacitor 74 on the Vdrain line during reading and/or sensing, thereby reducing the read/sense times compared to embodiments using non-tristated pulse drivers.

Figure 17:
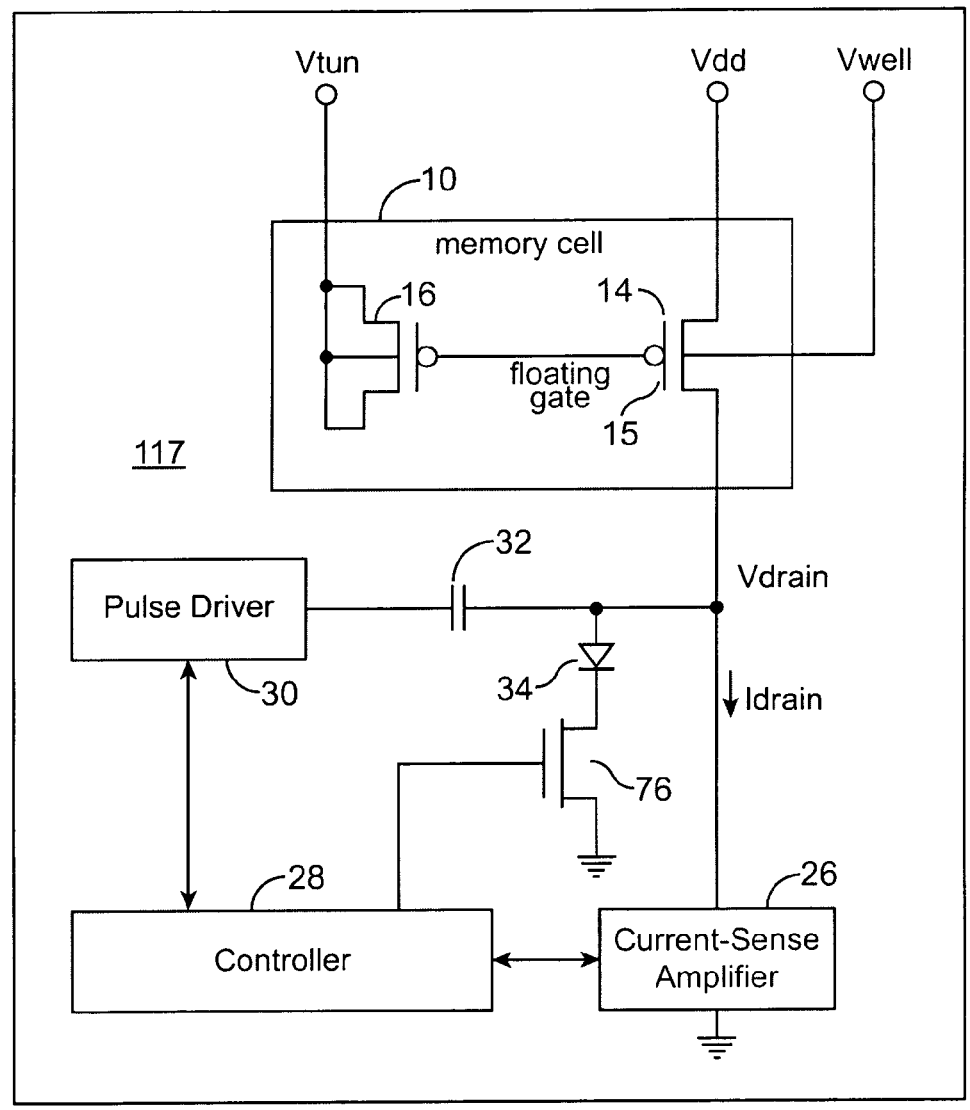
FIG. 17 shows the memory circuit of FIG. 3A, modified so that it incorporates an nFET in series with a diode, according to an embodiment of the present invention.

FIG. 17 shows the memory circuit of FIG. 3A, modified so that it incorporates an nFET 76 in series with diode 34, according to an embodiment of the present invention. nFET 76 of memory circuit 117 has a gate, which is controlled by controller 28, a drain coupled to the cathode of diode 34 and a source coupled to ground. Controller 28 is configured to turn off nFET 76 during reading/sensing. A benefit of using nFET 76 is that, when nFET 76 is turned off, Vdrain can have values greater than 700 mV above ground. Note that diode 34 may comprise a source-follower or diode-connected pFET, rather than a p-n junction as shown, and that nFET 76 may be used in all the other circuit implementations in this disclosure (such as, for example, being used in series with transistor 50 in FIG. 15A).

Figure 18:
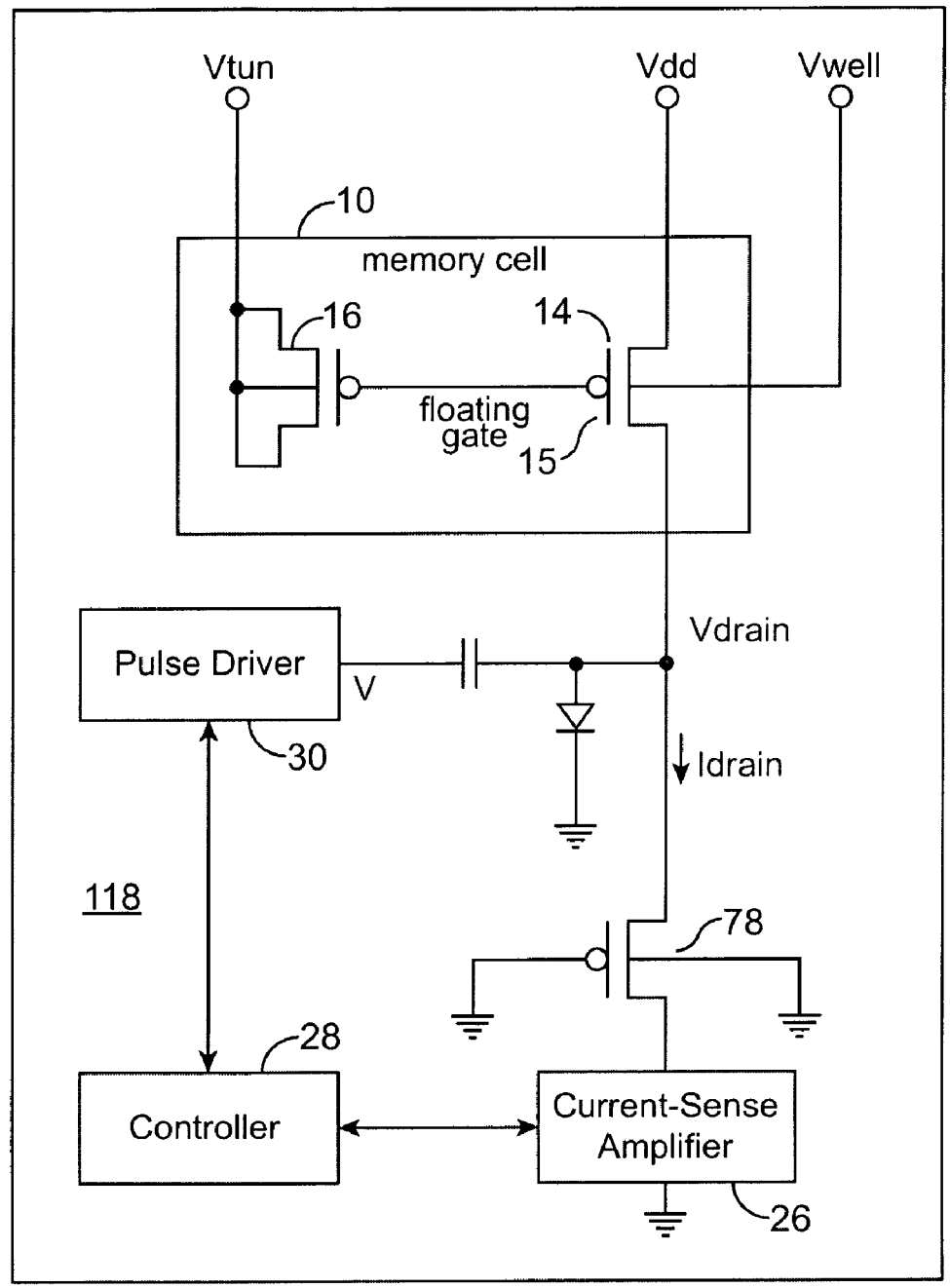
FIG. 18 shows the memory circuit of FIG. 3A, modified so that it incorporates a pFET between the current sense amplifier and the drain of the injection transistor, according to an embodiment of the present invention.

FIG. 18 shows the memory circuit of FIG. 3A, modified so that it incorporates a pFET 78 between current sense amplifier 26 and the drain of injection transistor 14, according to an embodiment of the present invention. pFET 78 of memory circuit 118 has a gate and body, both coupled to ground, a drain coupled to current sense amplifier 26 and a source coupled to the drain of injection transistor 14. The reason for adding pFET 78 is that, if current sense amplifier 26 has an n-type (i.e. nMOS or NPN) input stage, this stage's substrate-to-drain p-n junction cannot assume values more than about 700 mV below ground without turning on (assuming the chip substrate is grounded). Diode-connected pFET 78, or an alternative structure such as a p-n diode, allows Vdrain to pulse more than 700 mV below ground during injection.

Although embodiments have been shown using a single cell, the invention also covers memory devices with multiple cells. These are advantageously arranged along individually addressable lines, such as rows and columns. Moreover, it will be appreciated that a single counteracting circuit may be used for a group of memory cells, such as those along an individual one of the addressable lines.

Figure 19:
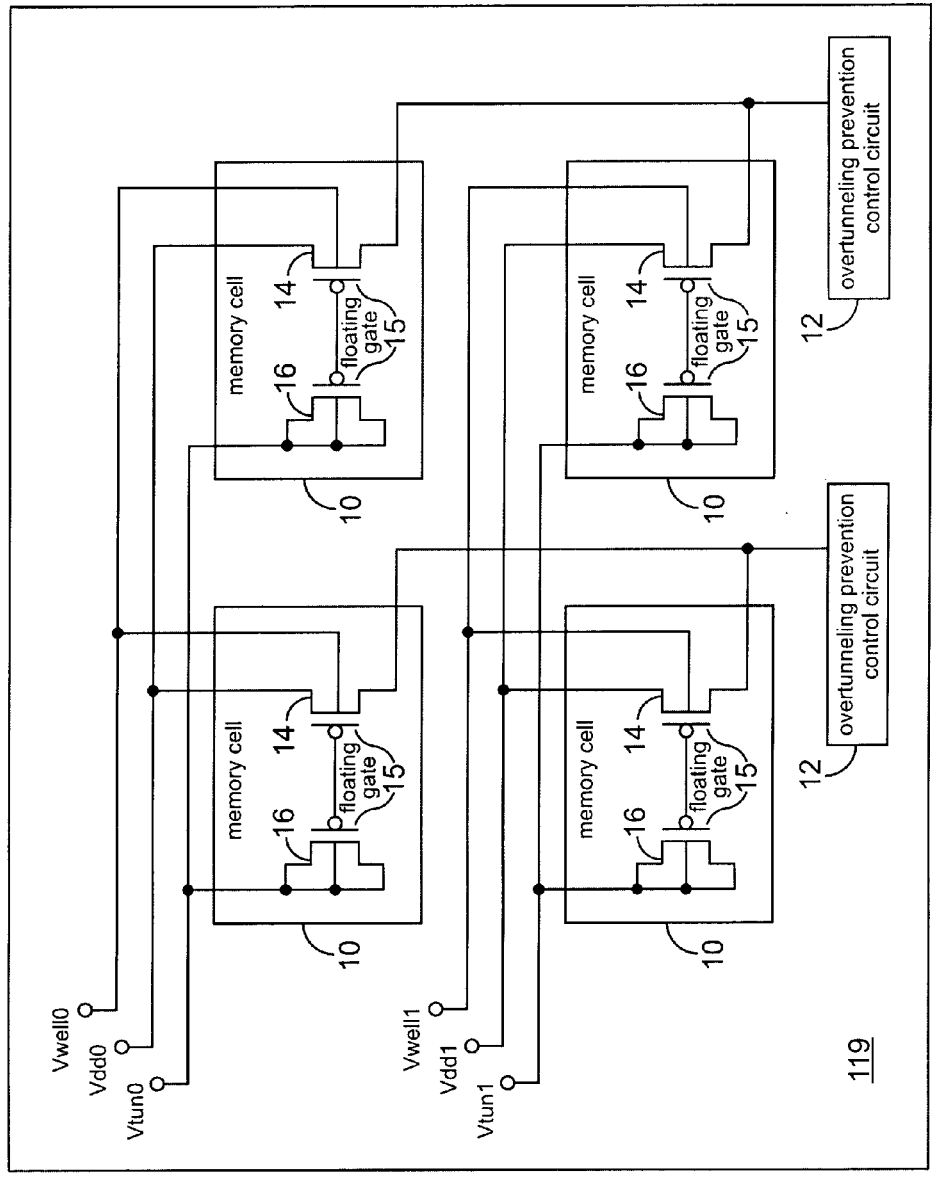
FIG. 19 shows an overtunneling prevention memory circuit including a 2×2 array of memory cells and associated overtunneling prevention control circuits, according to an embodiment of the present invention.

Referring now to FIG. 19, there is shown an overtunneling prevention memory circuit 119 including a 2×2 array of memory cells and associated overtunneling prevention control circuits, according to an embodiment of the present invention. In this embodiment the memory cells 10 in a first row of the array have injection transistors 14 with interconnected sources and interconnected bodies. The interconnected sources are coupled to a voltage source Vdd0 and the bodies are coupled to a well voltage source Vwell0. Tunneling capacitors 16 in the first row of the array are coupled to a tunneling voltage source Vtun0. Memory cells 10 in a second row of the array have injection transistors 14 and tunneling capacitors 16, which are configured similar to the injection transistors 14 and tunneling capacitors 16 in the cells in the first row, except that the various transistor and capacitor terminals are coupled to voltage sources Vdd1, Vwell1 and Vtun1, as shown in the figure. In this embodiment, each column of the array has an associated overtunneling prevention control circuit 12, which may comprise any of the previously described overtunneling prevention control circuits. An overtunneling prevention control circuit 12 of an associated column of the array is coupled to the drains of the injection transistors 14 of the memory cells 10 within the associated column. Additionally, the memory cells 10 may comprise any of the various memory cell embodiments shown in FIGS. 5–11 above (or others extrapolated from them) as appropriate. Those skilled in the art will also readily understand that, although only a 2×2 memory array is shown, the array size could be extended to any m-row by n-column, where m and n are integers both greater than or equal to two.

Figure 20:
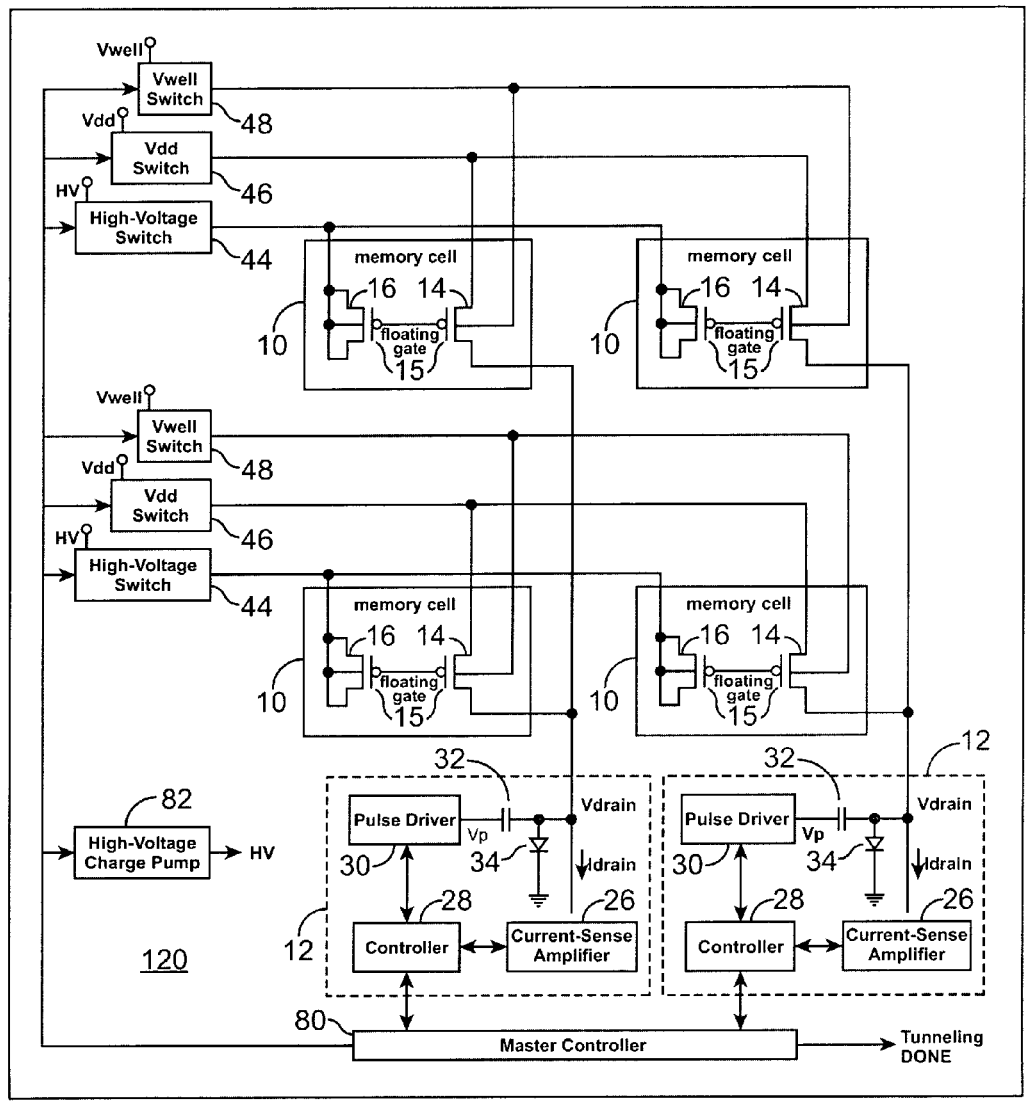
FIG. 20 shows an overtunneling prevention memory circuit including a 2×2 array of memory cells and associated overtunneling prevention control circuits, according to an embodiment of the present invention.

FIG. 20 shows an overtunneling prevention memory circuit 120 including a 2×2 array of memory cells and associated overtunneling prevention control circuits, according to an embodiment of the present invention. This alternative embodiment modifies the embodiment shown in FIG. 19, by adding a master controller 80 that controls the overtunneling prevention control circuits 12 of the two columns so that one row of the array is tunneled at a time. Master controller 80 may be also configured to control high-voltage switch 44, Vdd switch 46 and Vwell switch 48 in an associated row of the array, in the manner and for the purposes described above. Master controller 80 may also provide a "tunneling done" output for the following reason. As master controller 80 monitors the various controllers 28 of the corresponding overtunneling prevention control circuits 12, it knows which cells have tunneled to the point where they need injection pulses to prevent overtunneling. When every cell in a given row has undergone at least one injection pulse, then the cells have been tunneled to the desired value, so master controller 80 halts further tunneling pulses and issues the "tunneling done" signal. As with the embodiment in FIG. 19, overtunneling prevention control circuits 12 may comprise any of the previously described overtunneling prevention control circuits. Additionally, memory cells 10 may comprise any of the various memory cell embodiments shown in FIGS. 5–11 above (or others extrapolated from them) as appropriate.

Overtunneling prevention memory circuit 120 in FIG. 20 may further include a high-voltage charge pump 82, under the control of master controller 80. Use of charge pump 82 is as follows. Every nonvolatile memory system is faced with the dilemma of how to regulate the high-voltage charge pump's output voltage. If the voltage is too low, then the tunneling rate will be too slow. On the other hand, if the voltage is too high, then the memory cells may tunnel so fast that the overtunneling prevention control circuits, as controlled by master controller 80, cannot correct any overtunneling problems. In an embodiment including charge pump 82, charge pump 82 is unregulated (i.e. not set to a fixed voltage) and is designed to gradually ramp up its output voltage and use the "tunneling done" signal to turn off pumping, as soon as cells are fully tunneled. By this means the tunneling voltage is never too low because it continually ramps upward; the tunneling voltage is also never too high, because the master controller 80 turns off pumping when all cells are done (prior to the tunneling voltage becoming too high).

Figure 21:
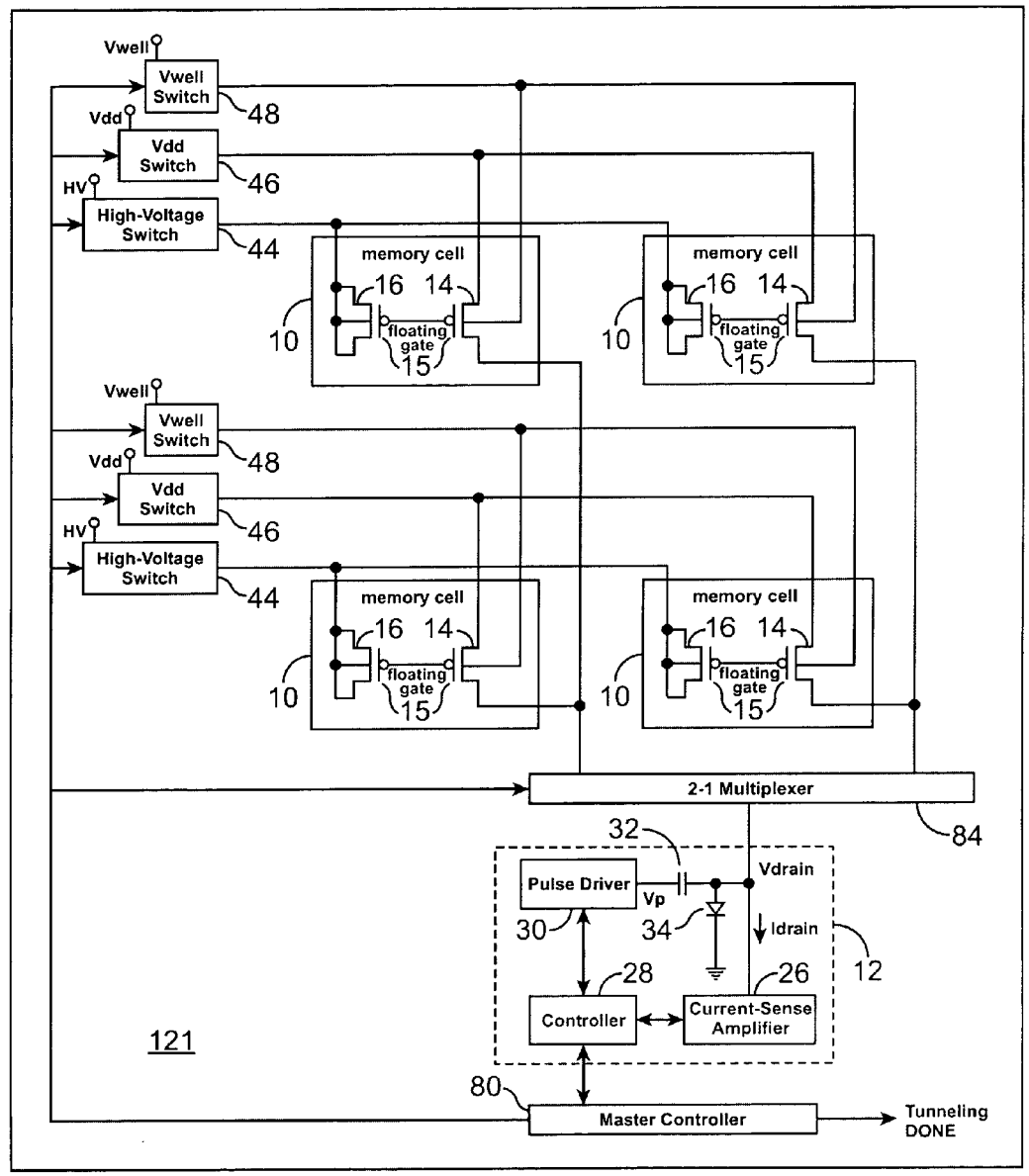
FIG. 21 shows an overtunneling prevention memory circuit including a 2×2 array of memory cells with a single shared overtunneling prevention control circuit, according to an embodiment of the present invention.

FIG. 21 shows an overtunneling prevention memory circuit 121 including a 2×2 array of memory cells with a single shared overtunneling prevention control circuit, according to an embodiment of the present invention. In contrast to the memory array embodiments shown in FIGS. 19 and 20, a 2:1 multiplexer 84 is employed to route selected column Vdrain lines into a single overtunneling prevention control circuit 12. This implementation saves circuit area compared to the embodiments shown in FIGS. 19 and 20. Memory circuit 121 functions as follows. A tunneling pulse is applied to one row of the array. Then, sequentially, using multiplexer 84 to select individual columns, each cell's drain current Idrain is measured. If necessary, one or more injection pulses are applied to correct overtunneled cells. As with the embodiments in FIGS. 19 and 20, overtunneling prevention control circuits 12 may comprise any of the previously described overtunneling prevention control circuits. Additionally, memory cells 10 may comprise any of the various memory cell embodiments shown in FIGS. 5–11 above (or others extrapolated from them) as appropriate. Those skilled in the art will also readily understand that, although a 2:1 multiplexer is shown, the multiplexer could be extended to any n:p multiplexer, where n is an integer that is greater than or equal to one and represents the number of columns in the memory array, and p is an integer that is greater than or equal to one and represents the number of overtunneling prevention control circuits coupled to the multiplexer.

Methods of the invention are now described in more detail. In a general method of the invention, charge is extracted from a floating gate of a transistor, such as a transistor of a memory cell. If an extraction threshold is sensed, the extraction of charge is counteracted. The extraction threshold may be sensed that it has been approached, reached or exceeded, by sensing a preset current or a potential.

In one embodiment, the preset current may be associated with a minimum channel current required to maintain a conducting channel in the transistor. In that case, counteracting is performed by adding charge to the gate.

In one embodiment, the charge is extracted by applying a high voltage to a capacitor structure that is associated with the gate. In that case, counteracting may be performed by switching off the high voltage. In other embodiments, counteracting is performed by switching off power to a terminal of the transistor, or to a well of the transistor. In some of those embodiments, the high voltage or power is switched off after overtunneling, in which case charge may be injected back into the floating gate.

While particular embodiments of the present invention have been shown and described, it will be obvious to those skilled in the art that, based upon the teachings herein, changes and modifications may be made without departing from this invention and its broader aspects. Therefore, the appended claims are intended to encompass within their scope all such changes and modifications as are within the true spirit and scope of this invention.

The invention claimed is:

1. A circuit comprising:
   a transistor with a floating gate;
   a capacitor structure for extracting charge from the floating gate; and
   a counteracting circuit to prevent extracting charge beyond a threshold, said counteracting circuit preventing said transistor from turning off due to an imbalance between charge added to the floating gate and charge extracted from the floating gate.

2. The circuit of claim 1, wherein the transistor is a pFET injection transistor.

3. The circuit of claim 2, further comprising:
   a coupling capacitor coupled between the floating gate and a source of the injection transistor.

4. The circuit of claim 1, wherein extracting is performed by tunneling.

5. The circuit of claim 1, wherein the transistor is an nFET transistor.

6. The circuit of claim 1, wherein the threshold is a preset amount of electrical current.

7. The circuit of claim 6, wherein the preset amount of electrical current is associated with a minimum channel current required to maintain a conducting channel in the transistor.

8. The circuit of claim 1, wherein the threshold is a preset amount of charge.

9. The circuit of claim 1, wherein the threshold is a preset electrical potential.

10. The circuit of claim 1, wherein the capacitor structure is made from a MOSFET structure.

11. The circuit of claim 1, wherein the counteracting circuit is adapted to add charge to the gate.

12. The circuit of claim 1, wherein the counteracting circuit is coupled to a drain of the transistor.

13. The circuit of claim 1, wherein the counteracting circuit includes a current source.

14. The circuit of claim 1, wherein the counteracting circuit includes a transistor having a gate coupled to a reference voltage.

15. The circuit of claim 1, wherein the counteracting circuit includes:
   a current sensor to monitor a drain current of the memory cell and to generate a trigger event when the threshold is reached, and
   a pulse driver to add charge to the gate responsive to the trigger event.

16. The circuit of claim 15, wherein the current sensor includes:
   a current sense amplifier, and
   a controller to provide a control signal responsive to the trigger event, and
   the pulse driver adds charge responsive to the control signal.

17. The circuit of claim 15, wherein the threshold is a preset amount of electrical current.

18. The circuit of claim 17, wherein the preset amount of electrical current is associated with a minimum channel current required to maintain a conducting channel in the transistor.

19. The circuit of claim 1, wherein the counteracting circuit includes a cutoff switch, and
   a sensor to trigger the cutoff switch when the threshold is reached.

20. The circuit of claim 19, wherein the cutoff switch is arranged to prevent a high voltage from being applied to the capacitor structure.

21. The circuit of claim 19, wherein the cutoff switch is arranged to prevent a power supply from being applied to a terminal of the transistor.

22. The circuit of claim 19, wherein the cutoff switch is arranged to prevent a power supply from being applied to a well of the transistor.

23. A memory device comprising:
means for extracting charge from a floating gate of a transistor; and
means for counteracting the extraction of charge if an extraction threshold is sensed, said means for counteracting preventing said transistor from turning off due to an imbalance between charge added to the floating gate and charge extracted from the floating gate.

24. The device of claim 23, wherein the extraction threshold is sensed by sensing a preset current.

25. The device of claim 24, wherein the preset current is associated with a minimum channel current required to maintain a conducting channel in the transistor.

26. The device of claim 23, wherein the extraction threshold is sensed by sensing a potential.

27. The device of claim 23, wherein the counteracting means adds charge to the gate.

28. The device of claim 23, wherein the extracting means applies a high voltage to a capacitor structure.

29. The device of claim 28, wherein the counteracting means switches off the high voltage.

30. The device of claim 23, wherein the counteracting means switches off power to a terminal of the transistor.

31. The device of claim 23, wherein the counteracting means switches off power to a well of the transistor.

32. A method comprising:
extracting charge from a floating gate of a transistor; and
if an extraction threshold is sensed, counteracting the extraction of charge by preventing said transistor from turning off due to an imbalance between charge added to the floating gate and charge extracted from the floating gate.

33. The method of claim 32, wherein the extraction threshold is sensed by sensing a preset current.

34. The method of claim 33, wherein the preset current is associated with a minimum channel current required to maintain a conducting channel in the transistor.

35. The method of claim 32, wherein the extraction threshold is sensed by sensing a potential.

36. The method of claim 32, wherein counteracting is performed by adding charge to the gate.

37. The method of claim 32, wherein the charge is extracted by applying a high voltage to a capacitor structure.

38. The method of claim 37, wherein counteracting is performed by switching off the high voltage.

39. The method of claim 32, wherein counteracting is performed by switching off power to a terminal of the transistor.

40. The method of claim 32, wherein counteracting is performed by switching off power to a well of the transistor.

* * * * *